US012476357B2

(12) United States Patent
Tamrakar et al.

(10) Patent No.: US 12,476,357 B2
(45) Date of Patent: Nov. 18, 2025

(54) ANTENNA ASSEMBLY WITH ISOLATION NETWORK

(71) Applicant: Intel Corporation, Santa Clara, CA (US)

(72) Inventors: Maruti Tamrakar, Tamil Nadu (IN); Sagar Gupta, Ghaziabad (IN); Jayprakash Thakur, Bangalore KA (IN); Rakhi Singh, Uttar Pradesh (IN)

(73) Assignee: Intel Corporation, Santa Clara, CA (US)

( * ) Notice: Subject to any disclaimer, the term of this patent is extended or adjusted under 35 U.S.C. 154(b) by 921 days.

(21) Appl. No.: 17/129,705

(22) Filed: Dec. 21, 2020

(65) Prior Publication Data

US 2021/0111486 A1 Apr. 15, 2021

(51) Int. Cl.
*H01Q 1/22* (2006.01)
*H01Q 1/24* (2006.01)
(Continued)

(52) U.S. Cl.
CPC ............. *H01Q 1/52* (2013.01); *H01Q 1/2283* (2013.01); *H01Q 1/243* (2013.01); *H03H 7/38* (2013.01)

(58) Field of Classification Search
CPC ........ H01Q 1/52; H01Q 1/2283; H01Q 1/243; H01Q 1/2266; H01Q 5/328; H01Q 5/335;
(Continued)

(56) References Cited

U.S. PATENT DOCUMENTS 8,957,827 B1 * 2/2015 Lee ........................ H01Q 5/378
343/702
9,413,058 B1 * 8/2016 Kuo ....................... H01Q 5/335
(Continued)

FOREIGN PATENT DOCUMENTS

CN 107317103 A * 11/2017 ............... H01Q 1/38
CN 110224226 A 9/2019
(Continued)

OTHER PUBLICATIONS

Extended European Search Report (EESR) received from EPO dated Mar. 17, 2022, 12 pages.
(Continued)

*Primary Examiner* — Dimary S Lopez Cruz
*Assistant Examiner* — Bamidele A Immanuel
(74) *Attorney, Agent, or Firm* — Schwabe, Williamson & Wyatt, P.C.

(57) ABSTRACT

Various embodiments provide an antenna assembly and associated systems, devices, and methods. The antenna assembly may include two or more antennas, including a first antenna and a second antenna, coupled to a ground plane. The antenna assembly may further include an isolation network coupled to the ground plane between the first and second antennas. The isolation network may include a conductive structure between conductive antenna portions of the first and second antennas, and an isolation circuit coupled between the conductive structure and the ground plane. The isolation circuit may include a resistor, an inductor, and/or a capacitor (e.g., coupled in parallel with one another). Other embodiments may be described and claimed.

13 Claims, 16 Drawing Sheets

(51) Int. Cl.
*H01Q 1/52* (2006.01)
*H03H 7/38* (2006.01)

(58) Field of Classification Search
CPC ........ H01Q 9/42; H01Q 13/103; H01Q 21/28; H01Q 1/521; H03H 7/38
See application file for complete search history.

(56) References Cited

U.S. PATENT DOCUMENTS

| | | | | |
|---|---|---|---|---|
| 9,509,042 | B1 * | 11/2016 | Zheng | H01Q 1/48 |
| 9,867,139 | B1 * | 1/2018 | Khasgiwala | H04B 17/318 |
| 10,122,081 | B2 * | 11/2018 | Black | H01Q 1/243 |
| 10,135,125 | B2 * | 11/2018 | Vilenskiy | H01Q 1/273 |
| 10,381,710 | B1 * | 8/2019 | Kuo | H01Q 1/2266 |
| 10,389,021 | B1 | 8/2019 | Thakur | |
| 10,411,326 | B1 * | 9/2019 | Kuo | H01Q 5/328 |
| 10,461,406 | B2 * | 10/2019 | Harper | H01Q 7/005 |
| 10,608,691 | B1 * | 3/2020 | Zheng | H01Q 1/243 |
| 2010/0123640 | A1 * | 5/2010 | Hui | H01Q 9/0442 700/86 |
| 2012/0068893 | A1 * | 3/2012 | Guterman | H01Q 1/2266 343/893 |
| 2012/0274522 | A1 * | 11/2012 | Ayatollahi | H01Q 1/243 343/745 |
| 2012/0319904 | A1 * | 12/2012 | Lee | H01Q 9/42 343/700 MS |
| 2013/0057438 | A1 * | 3/2013 | Satou | H01Q 1/521 343/893 |
| 2013/0069842 | A1 * | 3/2013 | Lee | H01Q 5/371 343/853 |
| 2013/0241793 | A1 * | 9/2013 | Ai | H01Q 9/42 343/893 |
| 2014/0139391 | A1 * | 5/2014 | Lo | H01Q 21/28 343/841 |
| 2014/0152514 | A1 * | 6/2014 | Vilenskiy | H01Q 9/0421 343/718 |
| 2015/0244411 | A1 * | 8/2015 | Harper | H01Q 9/14 455/77 |
| 2015/0288061 | A1 * | 10/2015 | Liu | H01Q 1/526 29/601 |
| 2016/0006119 | A1 * | 1/2016 | Wu | H01Q 1/523 343/853 |
| 2016/0248154 | A1 * | 8/2016 | Tian | H01Q 15/006 |
| 2016/0248163 | A1 * | 8/2016 | Pan | H01Q 9/42 |
| 2016/0285159 | A1 * | 9/2016 | Caporal Del Barrio | H01Q 1/38 |
| 2017/0012345 | A1 * | 1/2017 | Zhang | H01Q 1/38 |
| 2017/0077599 | A1 * | 3/2017 | Sayama | H01Q 1/48 |
| 2018/0048052 | A1 | 2/2018 | Jin et al. | |
| 2018/0316088 | A1 * | 11/2018 | Wen | H01Q 21/28 |
| 2019/0007120 | A1 * | 1/2019 | Hu | H01Q 9/0421 |
| 2019/0115654 | A1 * | 4/2019 | Huang | H01Q 9/40 |
| 2019/0252770 | A1 * | 8/2019 | Thakur | H01Q 5/335 |
| 2019/0312336 | A1 * | 10/2019 | Son | H01Q 21/30 |
| 2019/0326683 | A1 * | 10/2019 | Su | H01Q 21/0006 |
| 2019/0348750 | A1 * | 11/2019 | Lin | H01Q 9/42 |
| 2019/0372215 | A1 * | 12/2019 | Lee | H01Q 5/378 |
| 2020/0161755 | A1 * | 5/2020 | Olesen | H04B 1/525 |
| 2020/0303824 | A1 * | 9/2020 | Barrera | H01Q 13/18 |
| 2021/0126356 | A1 * | 4/2021 | Fang | H01Q 5/307 |
| 2021/0359418 | A1 * | 11/2021 | Yoshikawa | H01Q 13/18 |
| 2021/0399435 | A1 * | 12/2021 | Yoshikawa | H01Q 1/38 |
| 2022/0006181 | A1 * | 1/2022 | Yoshikawa | H01Q 9/42 |
| 2024/0154314 | A1 * | 5/2024 | Lin | H01Q 1/521 |
| 2024/0235063 | A9 * | 7/2024 | Dong | H01Q 5/328 |

FOREIGN PATENT DOCUMENTS

| | | | | |
|---|---|---|---|---|
| CN | 111276806 A | * | 6/2020 | H01Q 1/36 |
| CN | 112086753 A | * | 12/2020 | H01Q 1/22 |
| WO | 2018219070 A1 | | 12/2018 | |

OTHER PUBLICATIONS

European Patent Office; Office Action issued for Patent Application No. 21197377.1 on Jun. 6, 2024, 8 pages.

European Patent Office; Communication under Rule 71(3) EPC issued for Patent Application No. 21197377.1 mailed on Jun. 13, 2025, 8 pages.

* cited by examiner

ANTENNA ASSEMBLY WITH ISOLATION NETWORK

FIELD

Embodiments of the present invention relate generally to the technical field of wireless communications, and more particularly to antenna assemblies for wireless communication devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Recent development in wireless technologies (e.g., Wi-Fi 6E and 5G) require more than 6 antennas in a communication device. It can be challenging to place all the antennas in the device while providing good performance. For example, some systems (e.g., with lighter, thinner and/or bezel-less design) require a full metal chassis system with all the antennas on the base. Additionally, modern mobile devices have limited space available for antenna placement to achieve good performance. Furthermore, if the antennas are placed close to each other, it may yield poor isolation, which causes a drop in wireless throughput. It is also difficult to achieve good impedance matching for wide bandwidth if antennas are kept next to each other due to mutual coupling.

Furthermore, the frequency bandwidth of wireless technologies (e.g., Wi-Fi 6E and 5G) is also increasing with demand of higher data rate. In Wi-Fi 6E an additional frequency band is added (e.g., 5.925-7.125 GHz), and the Wi-Fi 6E operating band includes 2.4-2.5 GHz, 5.15-5.85 GHz and 5.925-7.125 GHz. Similarly, 5G cellular wireless technology has also added additional frequency bands (e.g., 0.617-0.7 GHz, 3.3-6.0 GHz). The 5G wireless technology operating band is 0.617-0.96 GHz, 1.7-2.7 GHz, 3.3-5.0 GHz and 5.0-6.0 GHz).

Accordingly, modern communication devices may require multiple wideband antennas that are challenging to place in the device while providing good performance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 9A is a top view from a rear cover (A-cover) side of the computing device.

FIGS. 9B and 9C are perspective views of respective ends of the computing device from the rear cover side. FIG. 9D is a top view from the display side of the computing device, showing internal components thereof. FIG. 9E shows close-up views of end regions of the view shown in FIG. 9D.

DETAILED DESCRIPTION

Figure 1:
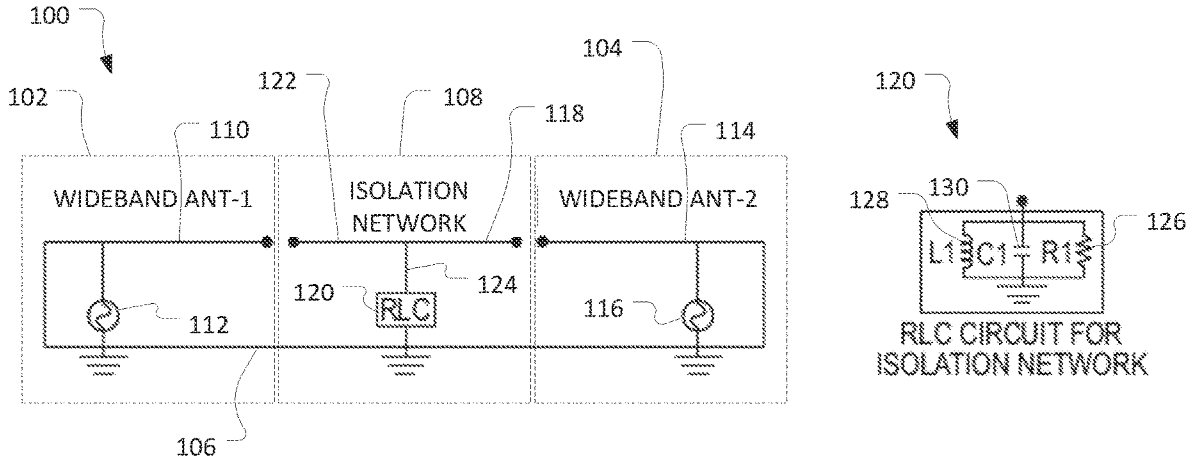
FIG. 1 schematically illustrates an antenna assembly including an isolation network between two antennas, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms “substantially,” “close,” “approximately,” “near,” and “about,” generally refer to being within +/−10% of a target value. Unless otherwise specified the use of the ordinal adjectives “first,” “second,” and “third,” etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases “A and/or B” and “A or B” mean (A), (B), or (A and B). For the purposes of the present disclosure, the phrase “A, B, and/or C” means (A), (B), (C), (A and B), (A and C), (B and C), or (A, B, and C).

The description may use the phrases “in an embodiment,” or “in embodiments,” which may each refer to one or more of the same or different embodiments. Furthermore, the terms “comprising,” “including,” “having,” and the like, as used with respect to embodiments of the present disclosure, are synonymous.

As used herein, the term “circuitry” may refer to, be part of, or include an Application Specific Integrated Circuit (ASIC), an electronic circuit, a processor (shared, dedicated, or group), a combinational logic circuit, and/or other suitable hardware components that provide the described functionality. As used herein, “computer-implemented method” may refer to any method executed by one or more processors, a computer system having one or more processors, a mobile device such as a smartphone (which may include one or more processors), a tablet, a laptop computer, a set-top box, a gaming console, and so forth.

Various embodiments herein include an antenna assembly with two or more antennas, and associated systems, devices, and methods. For example, an antenna assembly may include a first antenna and a second antenna coupled to a ground plane. The techniques described herein may be used with many different types of antennas, such as metal split antenna, slot antennas, metal ring antennas, printed circuit board (PCB) antennas, and/or flexible printed circuit board (FCP) antennas. For example, in some embodiments, the first and/or second antennas may be implemented by a chassis of an associated wireless communication device (e.g., portions of a metal chassis separated by one or more adjacent parting lines of a non-conductive material, such as plastic). Alternatively, or additionally, the first and/or second antennas may be implemented by a circuit board, such as a PCB and/or a FCP, and/or another suitable structure.

The antenna assembly may further include an isolation network coupled to the ground plane between the first and second antennas. The isolation network may include a conductive structure and an isolation circuit coupled between the conductive structure and the ground plane. The conductive structure may be at least partially located between conductive portions of the respective first and second antennas. In some embodiments, the conductive structure may include a first portion that is between the respective conductive portions of the first antenna and the second antenna, and a second portion to conductively couple the first portion to the isolation circuit, wherein a width of the first portion is greater than a width of the second portion. For example, the first portion and the second portion of the conductive structure may form a “T” shape. In some embodiments, the first and/or second portions may be implemented by a portion of the metal chassis (e.g., separated from the respective conductive portions of the first antenna and the second antenna by one or more parting lines), a PCB, and/or an FCP. For example, in some embodiments, the first portion may be implemented by the metal chassis and the second portion may be implemented by an FCP.

The isolation network may further include an isolation circuit coupled between the conductive structure and the ground plane. In some embodiments, the isolation circuit may include one or more resistors, capacitors, and/or inductors. For example, the isolation circuit may include a resistor, a capacitor, and/or an inductor coupled in parallel with one another and coupled between the conductive structure and the ground plane. In some embodiments, the isolation circuit may be implemented on a circuit board, such as an FCP (e.g., the same FCP that implements the second portion of the conductive structure).

In various embodiments, the first antenna and/or second antenna may further include a feed network to pass a radio frequency (RF) signal to or from a conductive antenna portion of the respective antenna. For example, the feed network may include a feed element (e.g., a conductor such as a conductive cable, trace, and/or FCP) to pass the RF signal to or from the conductive antenna portion, a first one of an inductor or capacitor between the feed element and an internal node of the feed network, and a second one of an inductor or capacitor (e.g., a capacitor when the first one is an inductor or an inductor when the first one is a capacitor) between the internal node and ground (e.g., the ground plane). The selection/configuration of the inductor and capacitor may be based on the frequency range to be handled by the respective antenna. The feed network may further include another capacitor coupled between the internal node and the conductive antenna portion. The feed network may enable the antennas to operate over a wider frequency band compared with prior techniques.

In various embodiments, the first and second antennas (and/or other antennas included in the antenna assembly) may be used to communicate on any suitable frequency range and/or wireless communication protocol. For example, the first and/or second antenna may be used for 5G cellular communications (e.g., 5G multiple input, multiple output (MIMO) 04, 5G MIMO 03, and/or 5G low band (e.g., 0.617-0.96 GHz)) and/or wireless local area network (WLAN, e.g., WiFi) communications (e.g., WiFi-6E and/or another present or future WLAN protocol). In some embodiments, one or more of the antennas may be used for multiple wireless communication protocols (e.g., both 5G MIMO 03 and WiFi-6E).

In various embodiments, the isolation network described herein improve isolation between the first and second antennas and/or impedance matching for the first and/or second antennas. Additionally, or alternatively, the feed networks described herein may provide reduced return loss compared with prior techniques. Accordingly, the antenna assembly may provide reduced return loss and/or increased isolation over a wider frequency bandwidth than prior techniques, resulting in improved performance of the antennas.

Additionally, or alternatively, the isolation network may enable the first and second antennas to be spaced closely apart with reduced current coupling compared to prior configurations. For example, prior antenna configurations may require spacing between the antennas of at least ¼ of the wavelength (λ) of the associated communication signals for good isolation. In contrast, the antenna assembly described herein may include spacing of less than ¼ of the wavelength between the antennas (e.g., a reduced or no “keep out zone” between the antennas).

Embodiments may enable less space in a computer system to be allocated for antennas. Accordingly, the system may be designed with a thin and/or light form factor, and/or more space may be used for other system components. Additionally, or alternatively, embodiments may enable the antenna assemblies to be used in a system with a full metal chassis. Furthermore, the techniques described herein may allow coexistence of the antenna assemblies with other system components, such as one or more speakers, communication/power ports (e.g., Universal Serial Bus (USB), etc.), and/or lights/display elements (e.g., light emitting diodes).

These and other embodiments will be further described below with respect to the example implementations shown in the figures.

FIG. 1 illustrates an antenna assembly 100 in accordance with various embodiments. The antenna assembly 100 may include a first antenna 102 and a second antenna 104 coupled to a ground plane 106. The antenna assembly 100 may further include an isolation network 108 coupled to the ground plane 106 between the first antenna 102 and the second antenna 104. The antenna 102 may include a conductive antenna portion 110 and a feed network 112 coupled between the conductive antenna portion 110 and the ground plane 106. In embodiments, the conductive antenna portion 110 may also be directly conductively coupled to the ground plane, as shown in FIG. 1. For example, the conductive antenna portion 110 may be an elongate strip of conductive material, e.g., in an "L" shape or other suitable shape. Similarly, the antenna 104 may include a conductive antenna portion 114 and a feed network 116 coupled between the conductive antenna portion 114 and the ground plane 106.

In various embodiments, the isolation network 108 may include a conductive structure 118 and an isolation circuit 120. In embodiments, the conductive structure 118 may include a first portion 122 that is between the respective conductive portions 110 and 114 of the first and second antennas 102 and 104, and a second portion 124 to conductively couple the first portion 122 to the isolation circuit. The first portion may extend laterally such that a width of the first portion 122 is greater than a width of the second portion 124 (e.g., in a direction between the conductive antenna portions 110 and 114). Accordingly, the conductive structure 118 may have a "T" shape.

In some embodiments, as further shown in claim 1, the isolation circuit 120 may include a resistor 126, an inductor 128, and a capacitor 130 (e.g., also referred to as an RLC circuit). For example, the resistor 126, inductor 128, and capacitor 130 may be coupled in parallel with one another and between the conductive structure 118 and the ground plane 106. In other embodiments, the isolation circuit 120 may include additional components, fewer components, and/or a different arrangement of components. For example, some embodiments may include a capacitor and a resistor (e.g., coupled in parallel or in series with one another), and no inductor. Embodiments of the isolation circuit 120 may include any suitable values and/or configuration to provide the desired isolation performance. For example, some embodiments may implement a high-pass or band-pass filter. In some embodiments, the resistor 126 may have a value of 20 to 500Ω, such as about 50Ω, and/or the capacitor 130 may have a value of 1 to 20 pF, such as about 6 pF. It will be apparent that other values may be used.

In various embodiments, the isolation network 108 may improve isolation between the first antenna 102 and the second antenna 104 and/or impedance matching for the first antenna 102 and/or second antenna 104. Accordingly, the isolation network 108 may enable the first and second antennas 102 and 104 to be spaced closely apart with reduced current coupling compared to prior configurations. For example, in some embodiments, the antennas 102 and 104 may be spaced apart by less than ¼ of the wavelength of the RF signals, such as 1/10 of the wavelength or less.

Figure 2:
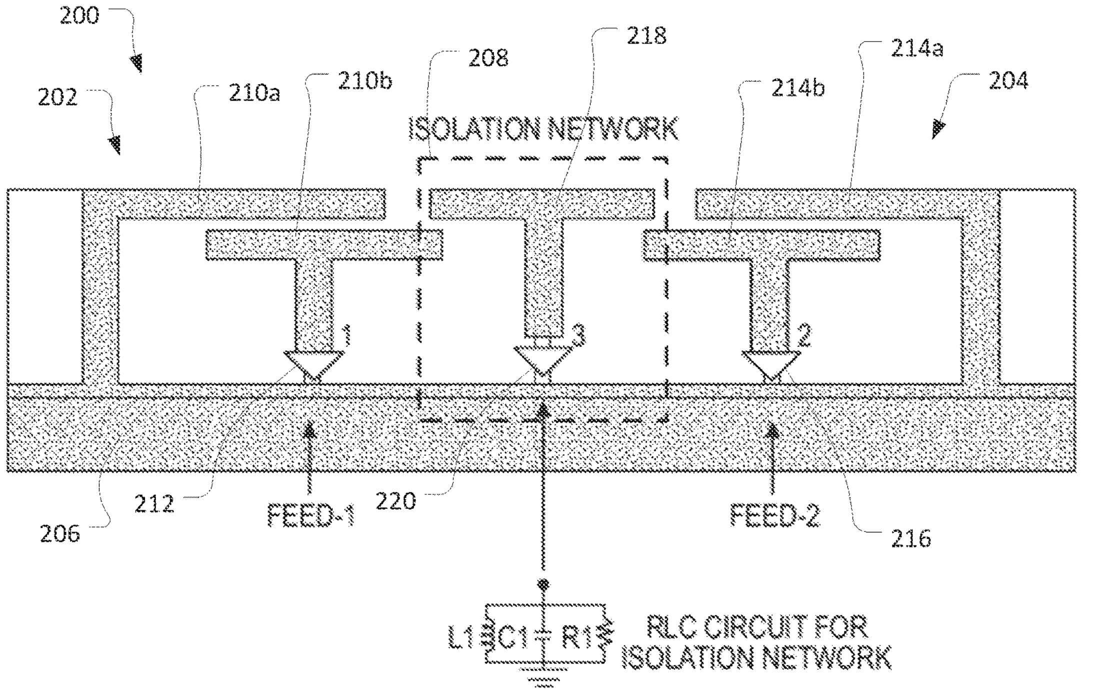
FIG. 2 illustrates an example antenna assembly in accordance with various embodiments.

FIG. 2 illustrates an antenna structure 200 that may correspond to one example of the antenna structure 100, in accordance with various embodiments. For example, the antenna structure 200 may include a first antenna 202 and a second antenna 204 coupled to a ground plane 206. The antenna 202 may include conductive antenna portions 210*a* and 210*b*. As shown, the conductive antenna portion 210*a* may be an "L" shape and conductive antenna portion 210*b* may be a "T" shape. It will be apparent that other configurations of the conductive antenna portions 210*a-b* may be used in other embodiments. A feed network 212 may be coupled between the conductive antenna portion 210*b* and the ground plane 206. The antenna 204 may include conductive antenna portions 214*a-b* and a feed network 216 coupled between the conductive antenna portion 214*b* and the ground plane 206.

An isolation network 208 may be coupled to the ground plane 206 between the antennas 202 and 204. The isolation network 208 may include a conductive structure 218 (e.g., a "T" shape conductive structure) and an isolation circuit 220 coupled between the conductive structure 218 and the ground plane 206. The isolation circuit 220 may correspond to the isolation circuit 120 shown in FIG. 1. For example, the isolation circuit 220 may be an RLC circuit with a resistor, an inductor, and a capacitor coupled in parallel with one another between the conductive structure 218 and the ground plane 206.

Figure 3A:
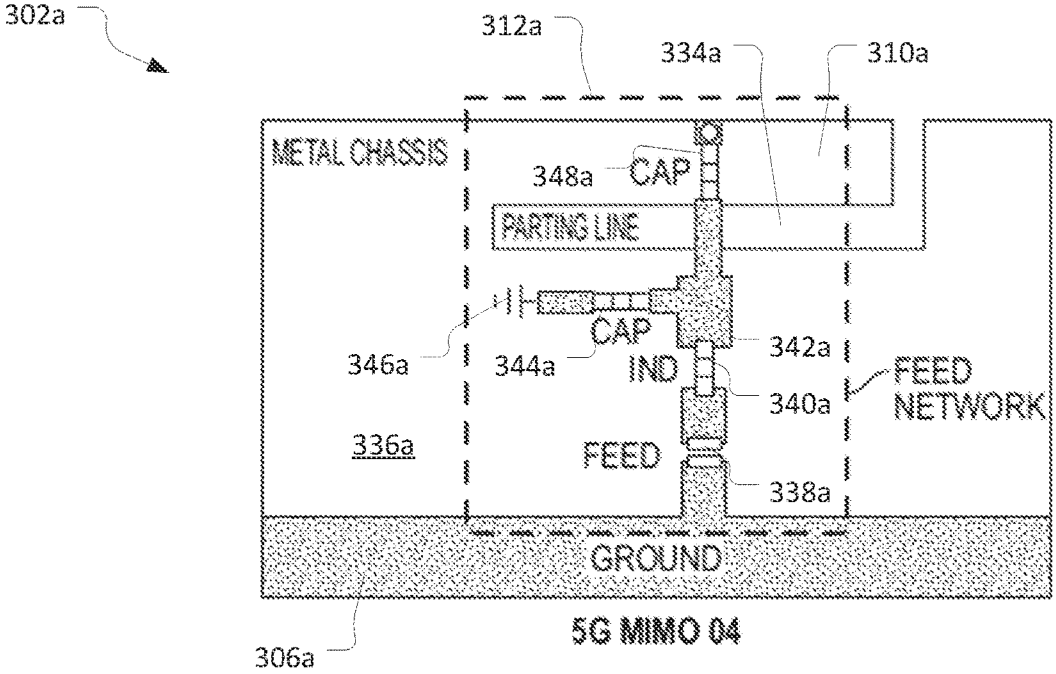
FIGS. 3A, 3B, and 3C illustrate example implementations of an antenna, in accordance with various embodiments.
Figure 3B:
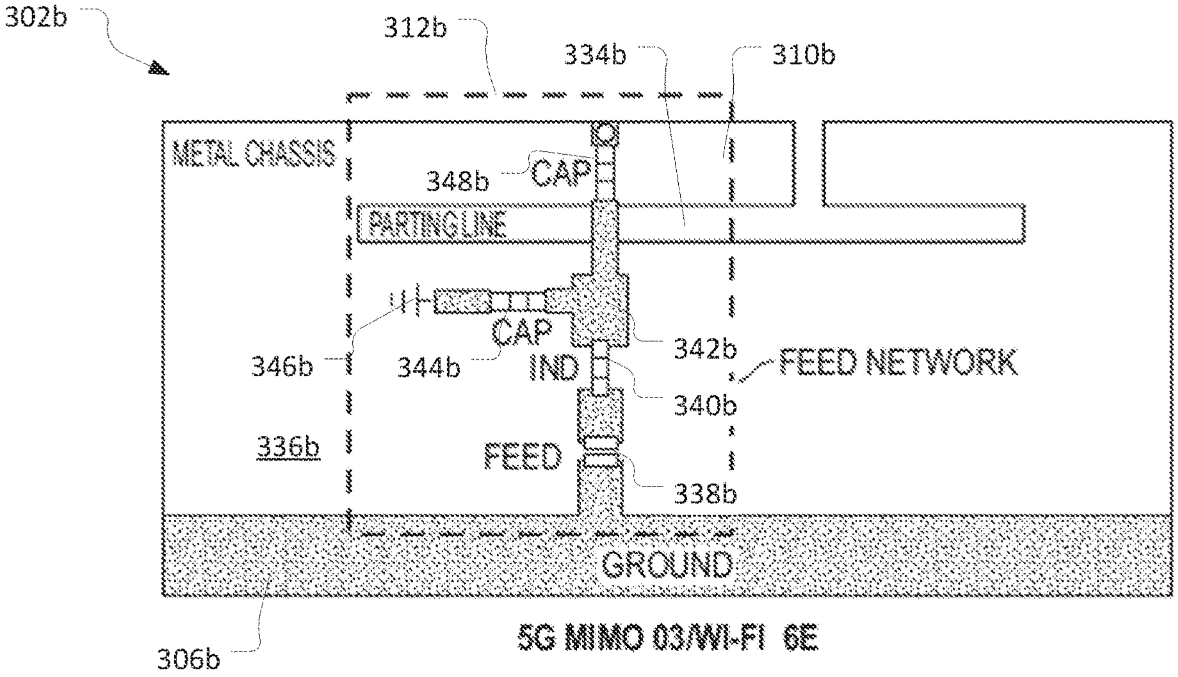
Figure 3C:
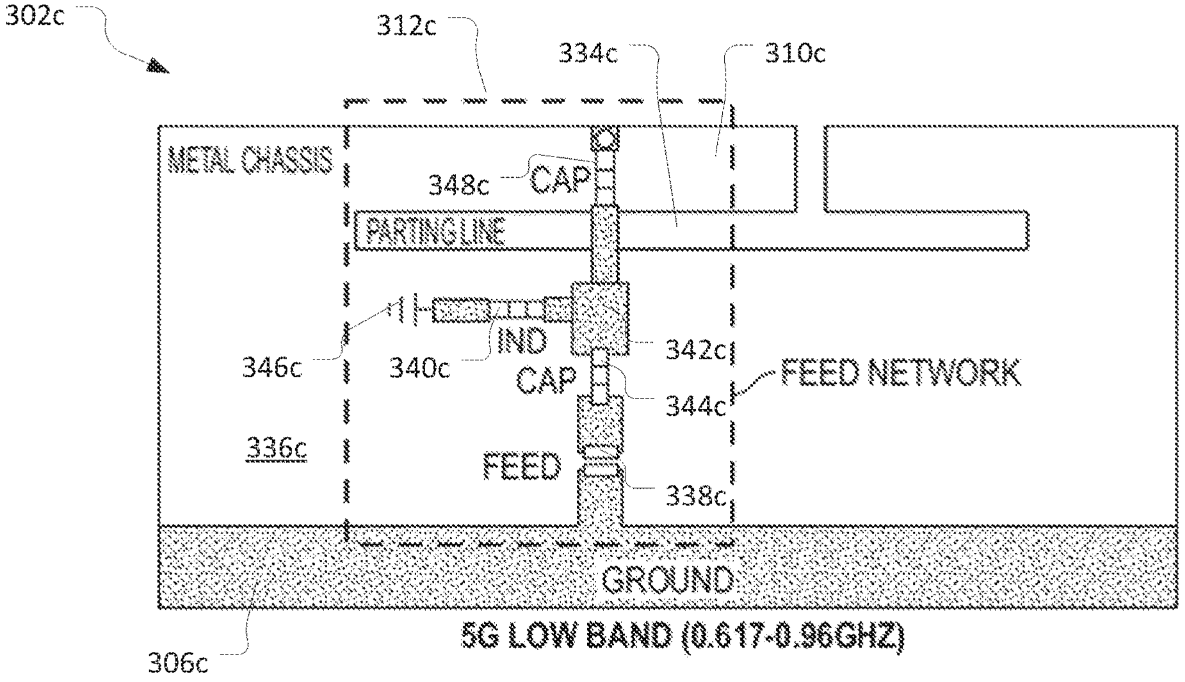

FIGS. 3A, 3B, and 3C illustrate antennas 302*a-c* that include respective examples of a feed network 312*a-c* in accordance with various embodiments. In embodiments, the feed network 312*a-c* may correspond to the feed network 112 and/or 116 discussed above. The antennas 302*a-c* may be designed to be used with different frequency ranges and/or wireless communication protocols. For example, the antenna 302*a* may be a 5G MIMO 04 antenna, the antenna 302*b* may be a 5G MIMO 03 and/or WiFi 6E antenna, and/or the antenna 302*c* may be a 5G low band antenna (e.g., used for a frequency range of 0.617-0.96 GHz and/or another suitable frequency range). The antennas 302*a-c* may include a conductive antenna portion 310*a-c* defined by a parting line 334*a-c*. In embodiments, the conductive antenna portion 310*a-c* be formed by a metal chassis. The conductive antenna portion 310*a-c* may be conductively coupled to a body 336*a-c* of the metal chassis (e.g., around the parting line 334*a-c*). The body 336*a-c* may be coupled to a ground plane 306. The ground plane 306 may correspond to chassis ground and/or PCB/FCP ground, which may be coupled to one another).

In other embodiments, the conductive antenna portion 310*a-c* may be formed by a PCB and/or another suitable conductive structure. For example, the conductive antenna portion 310*a-c* may include one or more conductive traces in the PCB. In some embodiments, the antenna 310*a-c* may be used with a communication device with a non-metal (e.g., plastic) chassis.

The parting line 334*a-c* may include a non-conductive material, such as a plastic and/or another suitable material. For example, the parting line 334*a-c* may be embedded in the metal chassis to separate the portions of the metal chassis on either side of the parting line 334*a-c* (although the portions of the metal chassis may still be coupled to one another around the parting line 334*a-c* as shown in FIGS. 3A-3C).

In various embodiments, the conductive antenna portion 310*a-c* and/or parting line 334*a-c* may have any suitable shape, e.g., based on the frequency range and/or wireless communication protocol for which the antenna 302*a-c* is to be used. For example, the parting line 334*a* may have an "L" shape, while the parting line 334*b-c* may have a "T" shape. It will be apparent that other shapes of the parting line and/or conductive antenna portion may be used, such as a parting line with an "F" shape or other suitable shape.

Figure 4A:
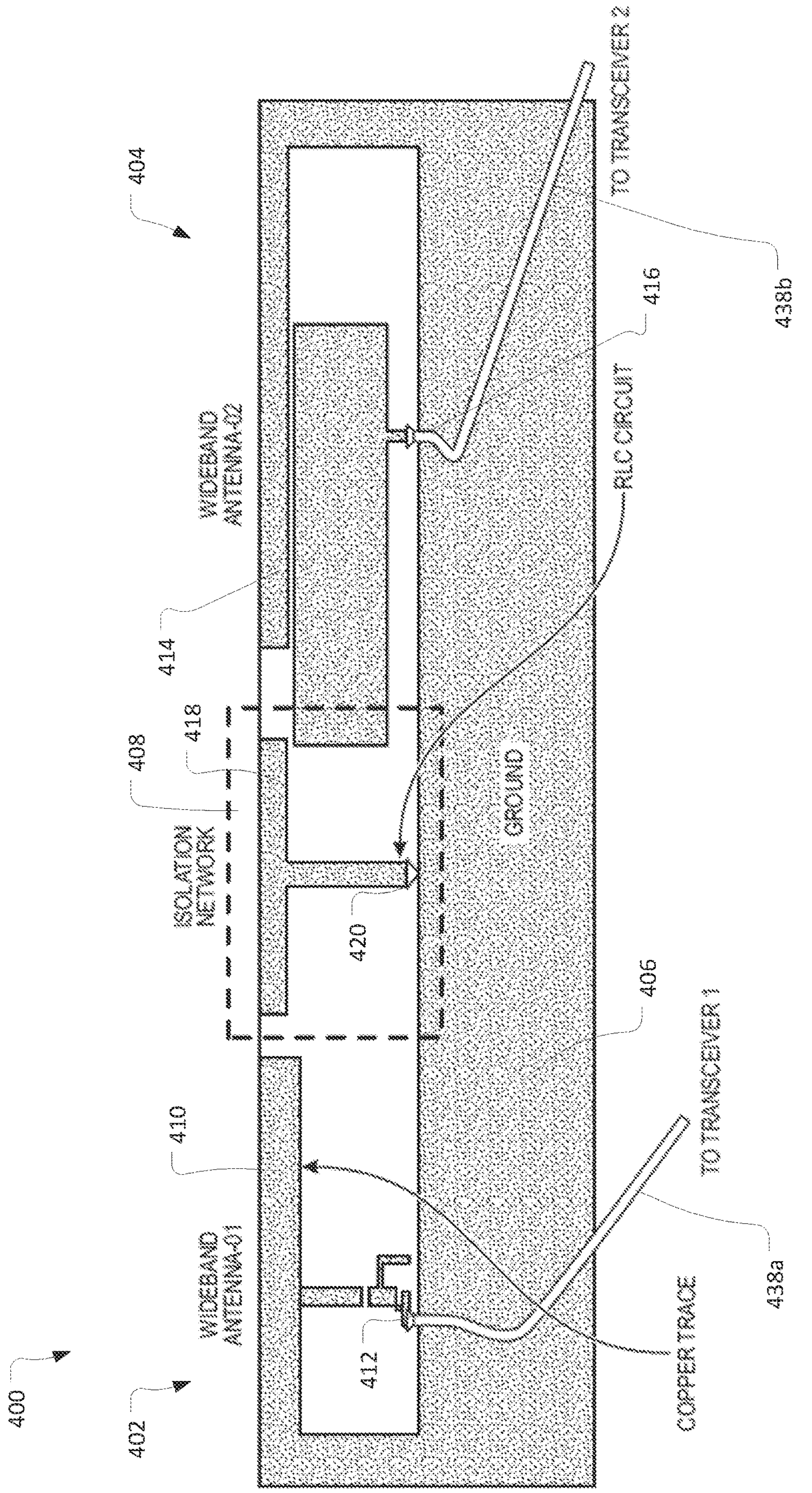
FIG. 4A illustrates an example of a printed circuit board (PCB) antenna assembly with an isolation network, in accordance with various embodiments.

In various embodiments, the feed network 312*a-c* may be coupled between the conductive antenna portion 310*a-c* and the ground plane 306*a-c*. The feed network 312*a-c* may include a feed element 338*a-c* to pass an RF signal to or from the conductive antenna portion 310*a-c* (e.g., for transmission or reception of the RF signal). For example, the feed element 338*a-c* may include a conductor, such as a conductive cable as shown in FIG. 4A, a conductive trace, and/or an FCP.

The feed network 312*a-c* may include circuit elements (e.g., one or more inductors and/or capacitors) to provide impedance matching and/or the frequency bandwidth of the antenna 302*a-c*. For example, as shown in FIGS. 3A and 3B, the feed network 312*a-b* may include an inductor 340*a-b* coupled between the feed element 338*a-b* and an internal node 342*a-b* of the feed network 312*a-b*. The feed network 312*a-b* may further include a capacitor 344*a-b* coupled between the internal node 342*a-b* and ground 346*a-b* (with may correspond to the ground plane 306*a-b*, the chassis ground, and/or a PCB/FCP ground, which in some embodiments may be coupled to one another).

In other embodiments, as shown in FIG. 3C, the feed network may include a capacitor 344*c* coupled between a feed element 338*c* and an internal node 342*c*, and an inductor 340*c* coupled between the internal node 342*c* and ground 346*c* (also referred to as coupled in shunt).

The arrangement and/or values of the inductor 340*a-c* and capacitor 344*a-c* in the feed network 312*a-c* may determine a frequency range of operation of the corresponding antenna 302*a-c*. For example, the antenna 302*c* may be used for a lower frequency range than antennas 302*a-b*.

In various embodiments, the feed network 312*a-c* may further include a capacitor 348*a-c* coupled between the internal node 342*a-c* and the conductive antenna portion 310*a-c*. The capacitor 348*a-c* may provide protection from electrostatic discharge (ESD) and/or other functionality.

The feed network 312*a-c* may enhance operating frequency bandwidth and impedance matching of the antenna 302*a-c*. For example, the feed network 312*a-c* may enable the antenna 302*a-c* to be tuned for wideband frequency operation. In some embodiments, one or more components of the feed network 312*a-c* may be tunable, e.g., as discussed further elsewhere herein.

In some embodiments, the feed network 312*a-c* may be at least partially included on an FPC. Additionally, the feed network 312*a-c* may be used with different configurations/types of antennas, such as metal split/slot antennas, PCB antennas, and/or metal ring antennas. Furthermore, the feed network 312*a-c* may be adapted for use with different frequency ranges and/or wireless communication protocols.

FIGS. 4A-4D, 5-8, and 9A-9E illustrate various example implementations of antenna assemblies in accordance with various embodiments. It will be apparent that various features of the antenna assemblies described elsewhere herein, e.g., with reference to FIGS. 1-3, may be used in the antenna assemblies of FIGS. 4A-9E. For ease of understanding, the descriptions of all of the components of the antenna assemblies will not be repeated for each figure.

For example, FIG. 4A illustrates an antenna assembly 400 in accordance with various embodiments. In some embodiments, the antenna assembly 400 may be implemented in a PCB and/or FCB. The antenna assembly 400 may include an isolation network 408 coupled to a ground plane 406 between antennas 402 and 404. The antenna 402 may include a conductive antenna portion 410 and a feed network 412, and the antenna 404 may include a conductive antenna portion 414 and the feed network 416. In embodiments, the conductive antenna portions 410 and 414 may have different configurations, as shown. The isolation network 408 may include a conductive structure 418 and an isolation circuit 420.

In some embodiments, the conductive antenna portion 410, conductive antenna portion 414, and/or conductive structure 418 may be included in a PCB (e.g., respectively formed by one or more conductive traces). Additionally, or alternatively, the feed network 412, feed network 416, and/or isolation circuit 420 may be implemented in a FCB and/or PCB. The feed network 412 may include a conductive cable 438*a* coupled to a first transceiver, and the feed network 416 may include a conductive cable 438*b* coupled to a second transceiver. The conductive cables 438*a-b* may correspond to the feed element of the respective feed network 412/416.

Figures 4B, 4C:
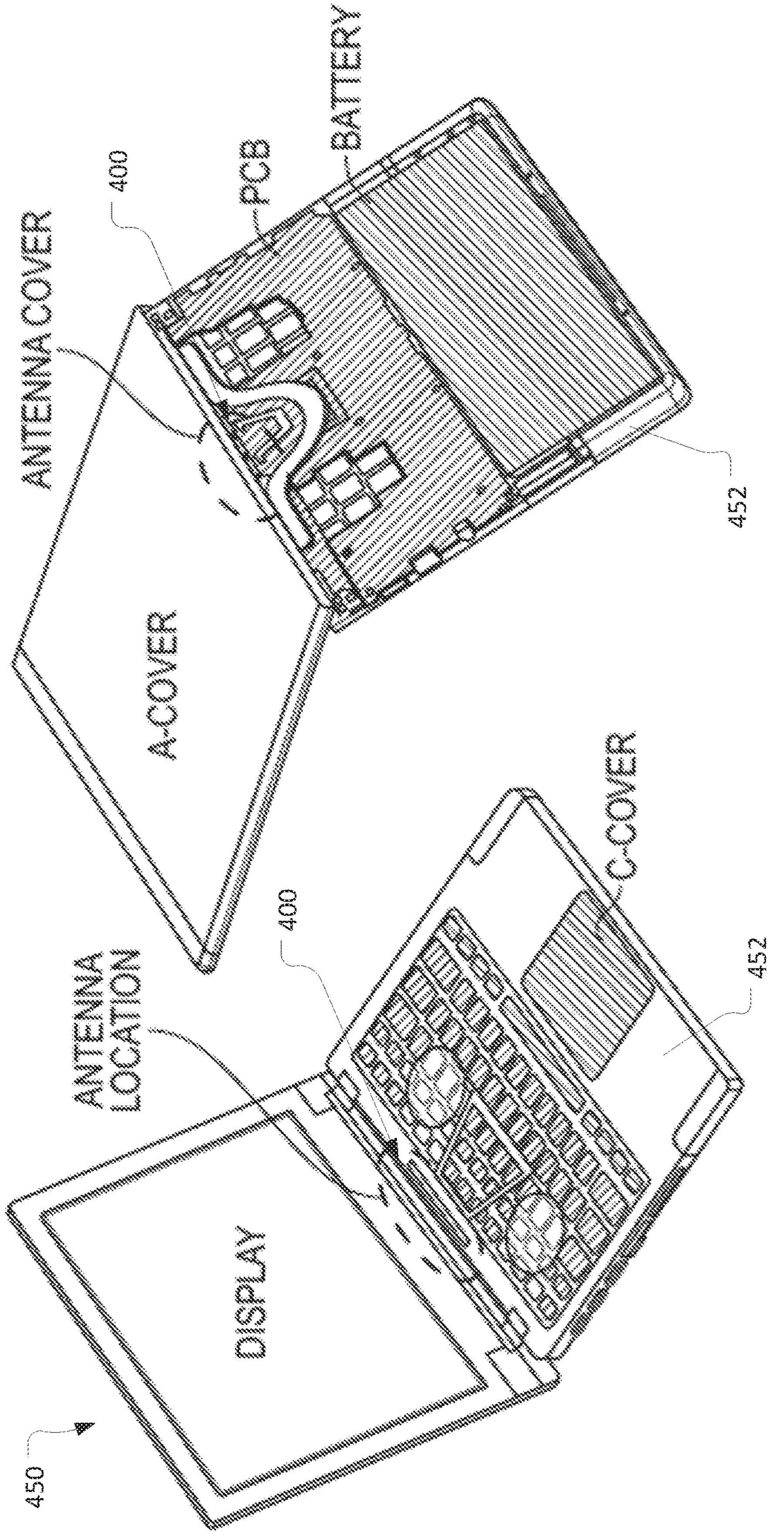
FIG. 4B illustrates a front perspective view of an example of a laptop computer that includes the antenna assembly of FIG. 4A, in accordance with various embodiments.
FIG. 4C illustrates a rear perspective view of the laptop computer of FIG. 4B with the rear cover removed to see internal components, in accordance with various embodiments.
Figure 4D:
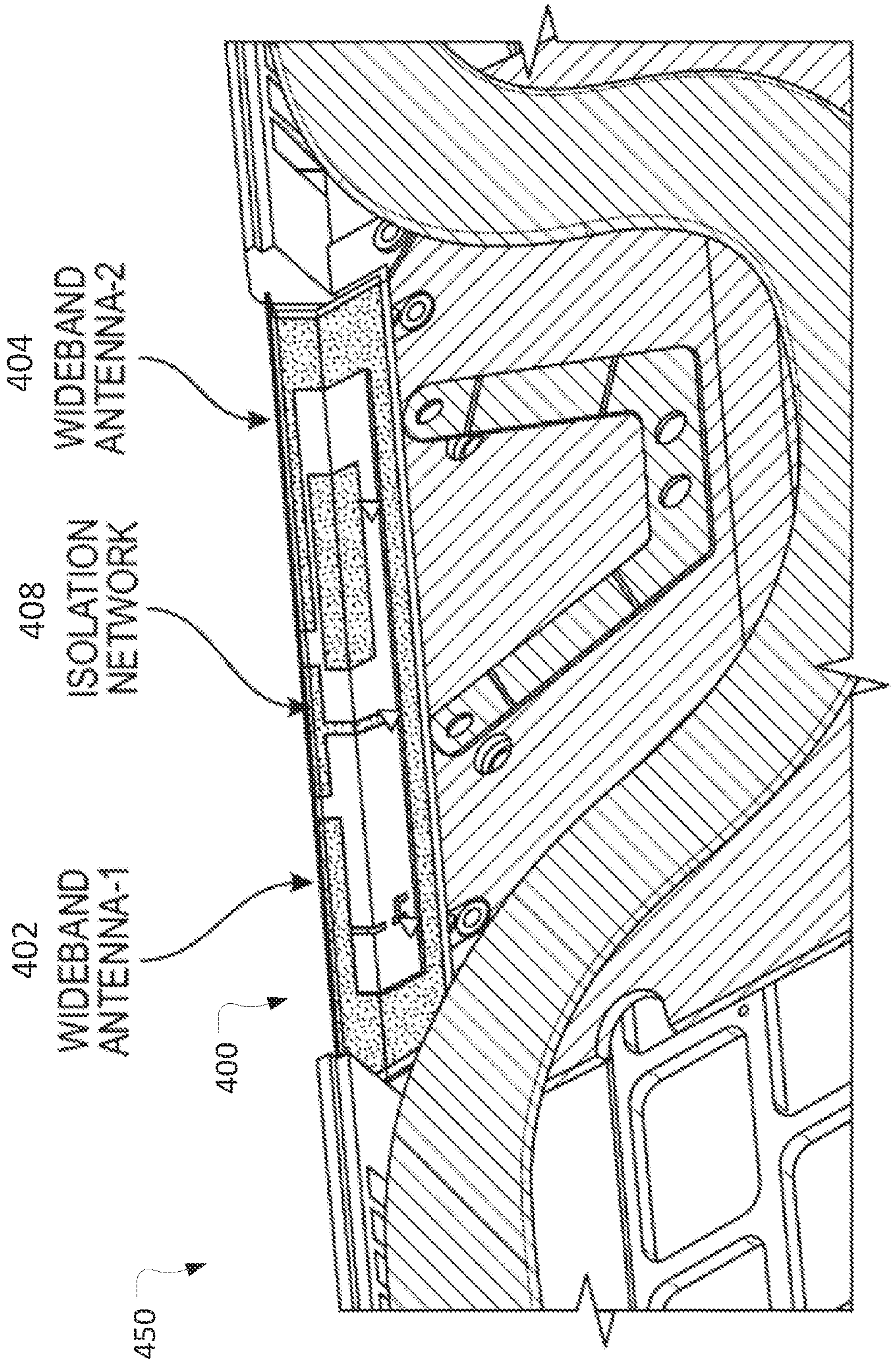
FIG. 4D illustrates a close-up view of a region of the laptop computer of FIG. 4B-4C that includes an antenna assembly, in accordance with various embodiments.

FIGS. 4B, 4C, and 4D illustrate the antenna assembly 400 included in a laptop computer system 450 (referred to as "laptop 450"), in accordance with various embodiments. The antenna assembly 400 may be included in the base 452 of the laptop 450, e.g., adjacent the hinge between the base and the cover/display 454. The antenna assembly 400 may be coupled to and/or included in a PCB 456 in the base 452 of the laptop 450.

Figure 5:
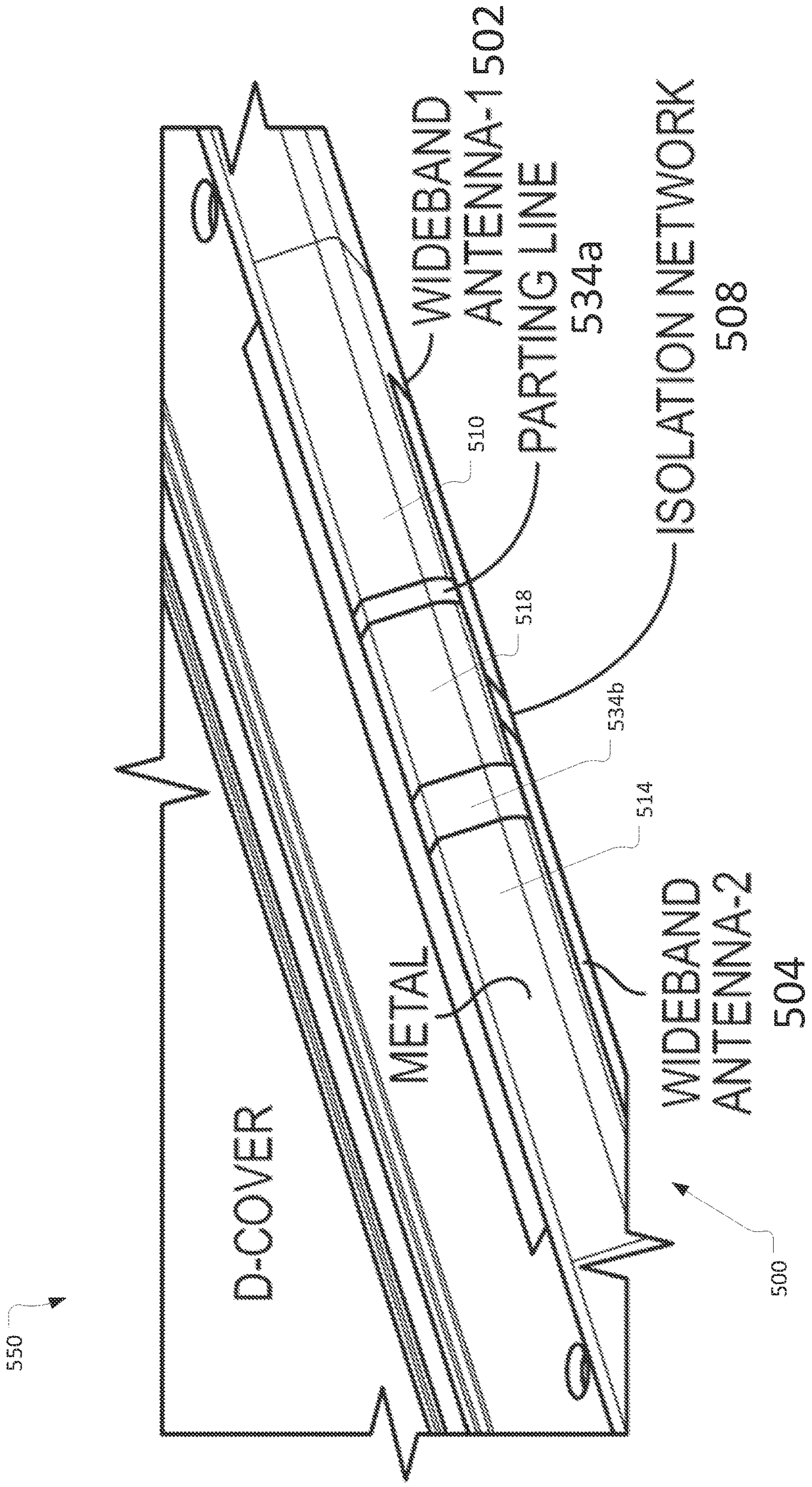
FIG. 5 illustrates another example implementation of an antenna assembly (e.g., including an aperture antenna) with an isolation network in a computer system, in accordance with various embodiments.

FIG. 5 illustrates another implementation of an antenna assembly 500 (which may be similar to the antenna assembly 400) in a laptop 550. The antenna assembly 500 may be an aperture antenna and/or metal ring antenna. The antenna assembly 500 may be located in and/or adjacent to a back cover 556 of the base (e.g., the D-cover) of the laptop 550.

The antenna assembly 500 may include a conductive antenna portion 510 of a first antenna and a conductive antenna portion 514 of a second antenna, with a conductive structure 518 of an isolation network disposed between them. Parting lines 534*a-b* may be between the conductive structure 518 and the respective conductive antenna structures 510 and 514.

Figure 6:
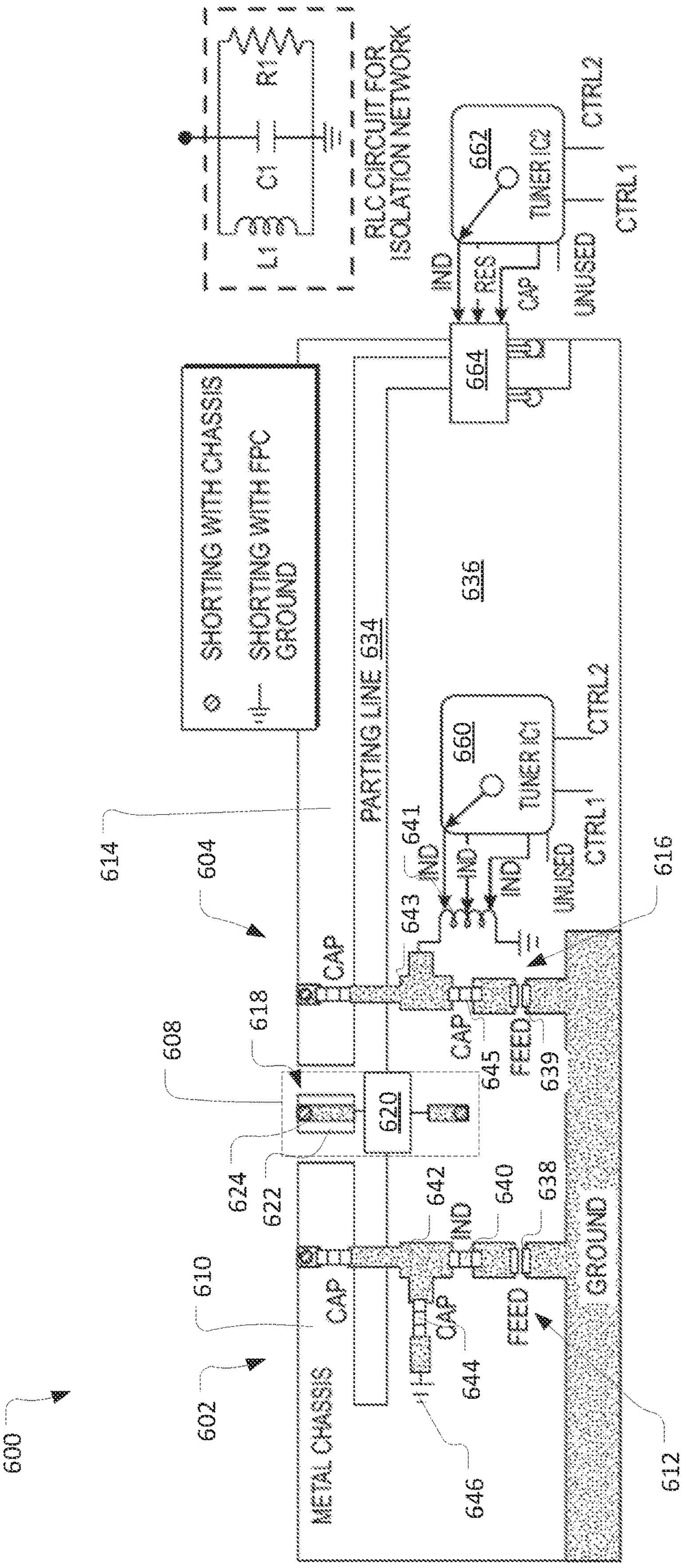
FIG. 6 illustrates an example of a dual feed antenna with an isolation network, in accordance with various embodiments.

FIG. 6 illustrates another antenna assembly 600 in accordance with various embodiments. Antenna assembly 600 is depicted as a metal split/slot antenna. Other embodiments may include another type of antenna. The antenna assembly 600 may be a dual feed antenna, e.g., with a first antenna 602 and a second antenna 604 with respective feed networks 612 and 616 to handle communication over different frequency bands of a same wireless communication protocol.

For example, in some embodiments, the antenna assembly 600 may be used for 5G wireless cellular communication. Implementation of a single-feed 5G antenna is a challenge in devices with a small form factor, such as mobile phones and/or tablets. Accordingly, a multi-feed antenna, such as antenna assembly 600 may be used to cover the required frequency band (e.g., 0.6 GHz.-6 GHz), with each antenna and associated feed network covering a portion of the frequency band.

In various embodiments, the feed network 612 may include an inductor 640 coupled between the feed element 638 and internal node 642, and a capacitor 644 coupled between the internal node 642 and ground 646. The feed network 616 may include a capacitor 645 coupled between the feed element 639 and an internal node 643, and an inductor 641 coupled between the internal node 643 and ground 646. Ground 646 may correspond to an FPC ground (e.g., when the feed network 612 and/or 616 are implemented in a FPC). The FPC ground may be coupled to the chassis body 636 (which may correspond to chassis ground). Ground 646 and/or chassis body 636 may correspond to the ground plane.

In various embodiments, the antenna assembly 600 may further include a first tuner circuit 660 and/or a second tuner circuit 662 coupled to the second antenna 604. The first tuner circuit 660 may be coupled to the inductor 641 of the feed network 616 to control an inductance of the inductor 641. An impedance matching circuit 664 may be coupled across the parting line 634 of the second antenna 604 (e.g., between conductive antenna portion 614 and chassis body 636) The second tuner circuit 662 may be coupled to the impedance matching circuit 664 to control a mode of the impedance matching circuit 664. For example, the mode may correspond to an impedance characteristic, such as inductive, resistive, and/or capacitive.

In embodiments, the first tuner circuit 660 and/or second tuner circuit 662 may receive one or more control signals (e.g., ctrl1 and ctrl2) to control a state of the second antenna 604. For example, Table 1 illustrates an example frequency band distribution for the antenna assembly 600. In the example, the first antenna 602 may cover the mid-band (e.g., 1.7-2.7 GHz) and a portion of the high band (e.g., 3.3-4.2 GHz) of 5G. The second antenna 604 may cover the low band (e.g., 0.617-0.96 GHz) and a portion of the high band (e.g., 4.4-6 GHz). The first tuner circuit 660 and second tuner circuit 662 may be used to cover the low band (e.g., 0.617-0.96 GHz) using three states, as shown. The second antenna 604 may cover different frequency ranges in the low band depending on the state. The frequency ranges may overlap with one another.

TABLE 1

Dual feed 5G antenna frequency band distribution

| Second Antenna | | | | | | First Antenna |
|---|---|---|---|---|---|---|
| Low Band | | | | | | Mid Band + |
| States | −4 dB Frequency Band (MHz) | Ctrl 1, Ctrl 2 | Tuner IC 1 | Tuner IC 2 | High Band (MHz) | High Band (MHz) |
| State 1 | 617-764 | 0, 0 | IND (34 nH) | IND (4.4 nH) | 4400-6000 | 1700-2700 |
| State 2 | 700-896 | 0, 1 | IND (25 nH) | RES (0 Ohm) | | 3300-4200 |
| State 3 | 820-960 | 1, 0 | IND (19 nH) | CAP (9.8 pF) | | |
| State 4 | | Unused | | | | |

For example, in a first state, the inductor 641 may have an inductance of 34 nanoHenry (nH), the matching circuit 664 may present an inductance of 4.4 nH, and the second antenna 604 may cover a frequency band of 617-764 MHz. In a second state, the inductor 641 may have an inductance of 25 nH, the impedance matching circuit may present a resistance of 0 Ohm (e.g., a short circuit), and the second antenna 604 may cover a frequency band of 700-896 MHz. In a third state, the inductor 641 may have an inductance of 19 nH, the matching circuit 664 may present a capacitance of 9.8 picoFarads (pF), and the second antenna 604 may cover a frequency band of 820-960 MHz.

In various embodiments, the antenna assembly 600 may further include an isolation network 608 coupled to the chassis body 636 (e.g., chassis ground, which may correspond to the ground plane) between the first antenna 602 and the second antenna 604. The isolation network 608 may include a conductive structure 618 between conductive antenna portions 610 and 614, and an isolation circuit 620 (e.g., RLC circuit) coupled between the conductive structure 618 and the chassis body 636. In embodiments, the conductive structure 618 may include a first conductive portion 622 that is implemented by the chassis and a second conductive portion 624 that is implemented by the FCP that includes the isolation circuit 620. The first conductive portion 622 may be wider than the second conductive portion 624, e.g., to form a "T" shape as discussed herein.

In various embodiments, the isolation network 608 may improve isolation between the first antenna 602 and the second antenna 604. The improved isolation may facilitate operation of the tuner circuits 660 and/or 662, so that controlling the low frequency bandwidth using the tuner circuits 660 and/or 662 does not affect the response of the feed network 612 of the other antenna 602. The isolation network 608 may additionally or alternatively improve impedance matching of the first antenna 602 and/or second antenna 604. Accordingly, the isolation network 608 may provide improved return loss characteristics compared with antenna assemblies that do not include an isolation network.

Figure 7:
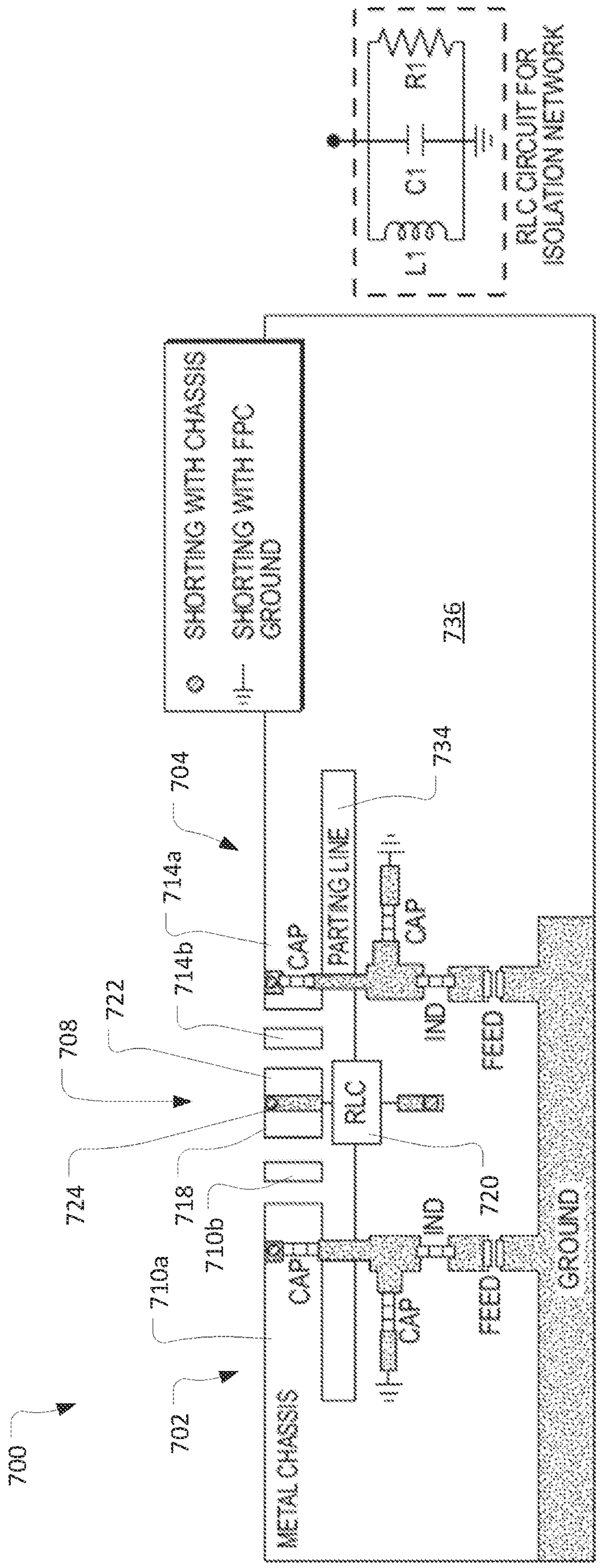
FIG. 7 illustrates another antenna assembly (e.g., including F-shaped metal split (slot) antennas) with an isolation network, in accordance with various embodiments.

FIG. 7 illustrates another antenna assembly 700 in accordance with various embodiments. The antenna assembly 700 may be a combo F-shaped metal split (slot) antenna. For example, the antenna assembly 700 may include a first antenna 702 and a second antenna 704 with an F-shaped parting line 734. Accordingly, the first antenna 702 may include conductive antenna portions 710*a-b*, and the second antenna 704 may include conductive antenna portions 714*a-b*. In some embodiments, the antenna assembly 700 may be used as a 5G-MIMO combo antenna.

In various embodiments, the antenna assembly 700 may further include an isolation network 708 coupled to the chassis body 736 (e.g., chassis ground, which may correspond to the ground plane) between the first antenna 702 and the second antenna 704. The isolation network 708 may include a conductive structure 718 between conductive antenna portions 710*a-b* and 714*a-b*, and an isolation circuit 720 (e.g., RLC circuit) coupled between the conductive structure 718 and the chassis body 736. In embodiments, the conductive structure 718 may include a first conductive portion 722 that is implemented by the chassis and a second conductive portion 724 that is implemented by the FCP that includes the isolation circuit 720. The first conductive portion 722 may be wider than the second conductive portion 724, e.g., to form a "T" shape as discussed herein.

In various embodiments, the isolation network 708 may improve the isolation and/or impedance matching for antennas 702 and/or 704.

Figure 8:
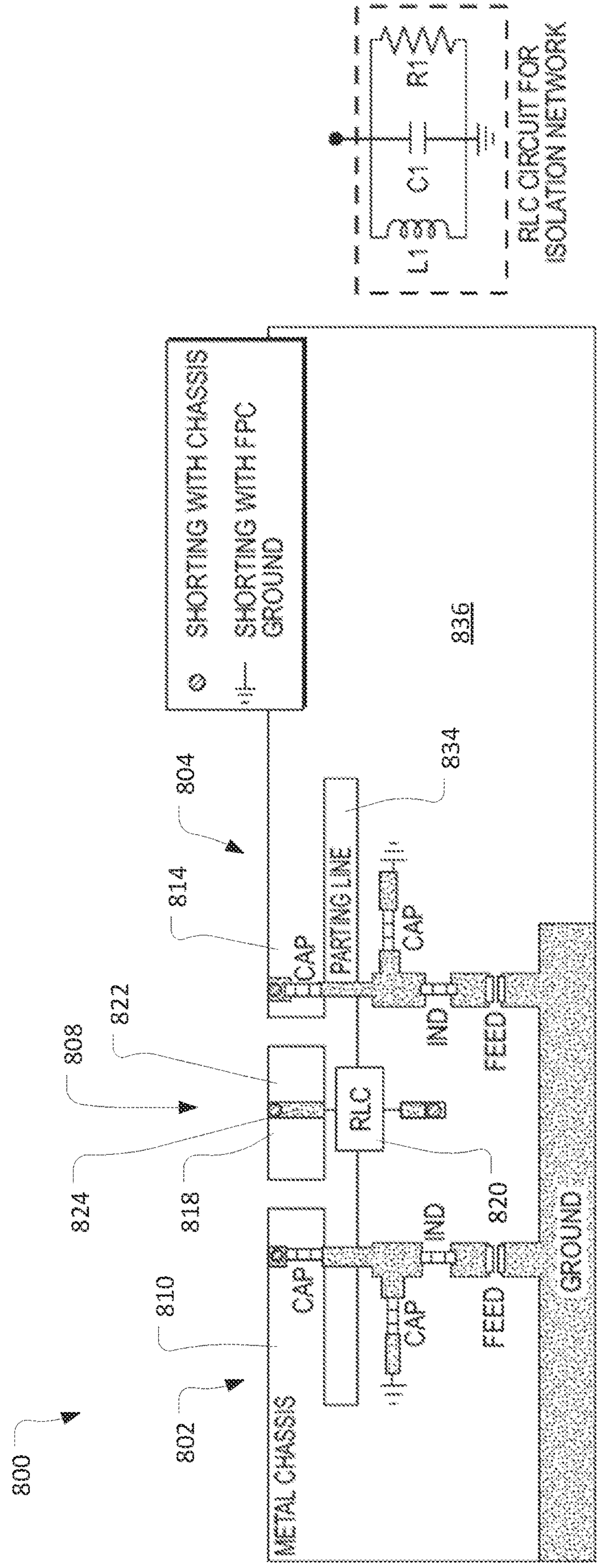
FIG. 8 illustrates another antenna assembly (e.g., including L-shaped metal split (slot) antennas) with an isolation network, in accordance with various embodiments.

FIG. 8 illustrates another antenna assembly 800 in accordance with various embodiments. The antenna assembly 800 may be a combo L-shaped metal split (slot) antenna. For example, the antenna assembly 800 may include a first antenna 802 and a second antenna 804 with an L-shaped parting line 834. Accordingly, the first antenna 802 may include a conductive antenna portions 810, and the second antenna 804 may include a conductive antenna portion 814.

In various embodiments, the antenna assembly 800 may further include an isolation network 808 coupled to the chassis body 836 (e.g., chassis ground, which may correspond to the ground plane) between the first antenna 802 and the second antenna 804. The isolation network 808 may include a conductive structure 818 between conductive antenna portions 810 and 814, and an isolation circuit 820 (e.g., RLC circuit) coupled between the conductive structure 818 and the chassis body 836. In embodiments, the conductive structure 818 may include a first conductive portion 822 that is implemented by the chassis and a second conductive portion 824 that is implemented by the FCP that includes the isolation circuit 820. The first conductive portion 822 may be wider than the second conductive portion 824, e.g., to form a "T" shape as discussed herein.

In various embodiments, the isolation network 808 may improve the isolation and/or impedance matching for antennas 802 and/or 804.

Figure 9A:
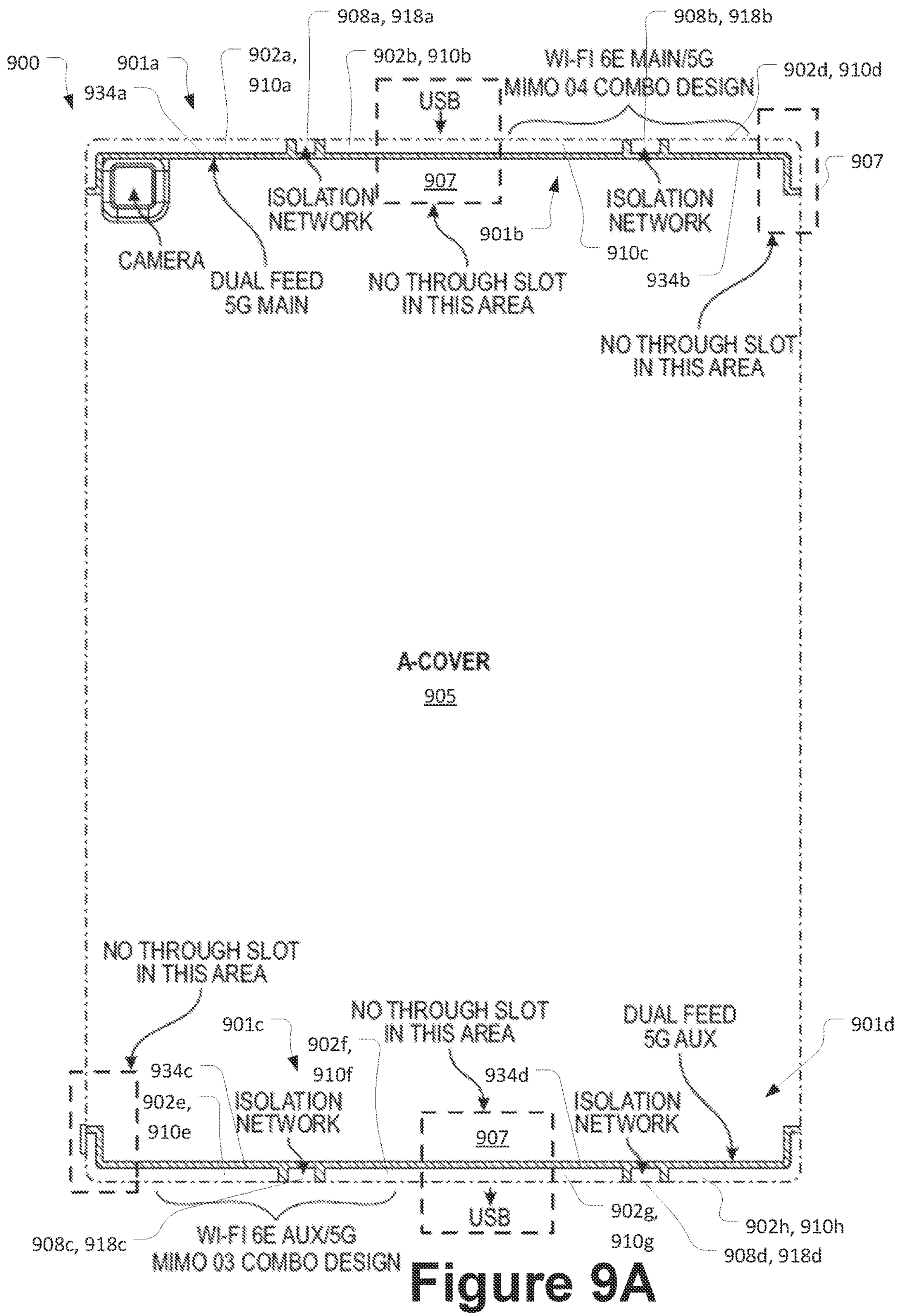
FIGS. 9A-9E illustrate various views of a computing device (e.g., a tablet computing device) that includes a plurality of antenna assemblies, in accordance with various embodiments.
Figure 9B:
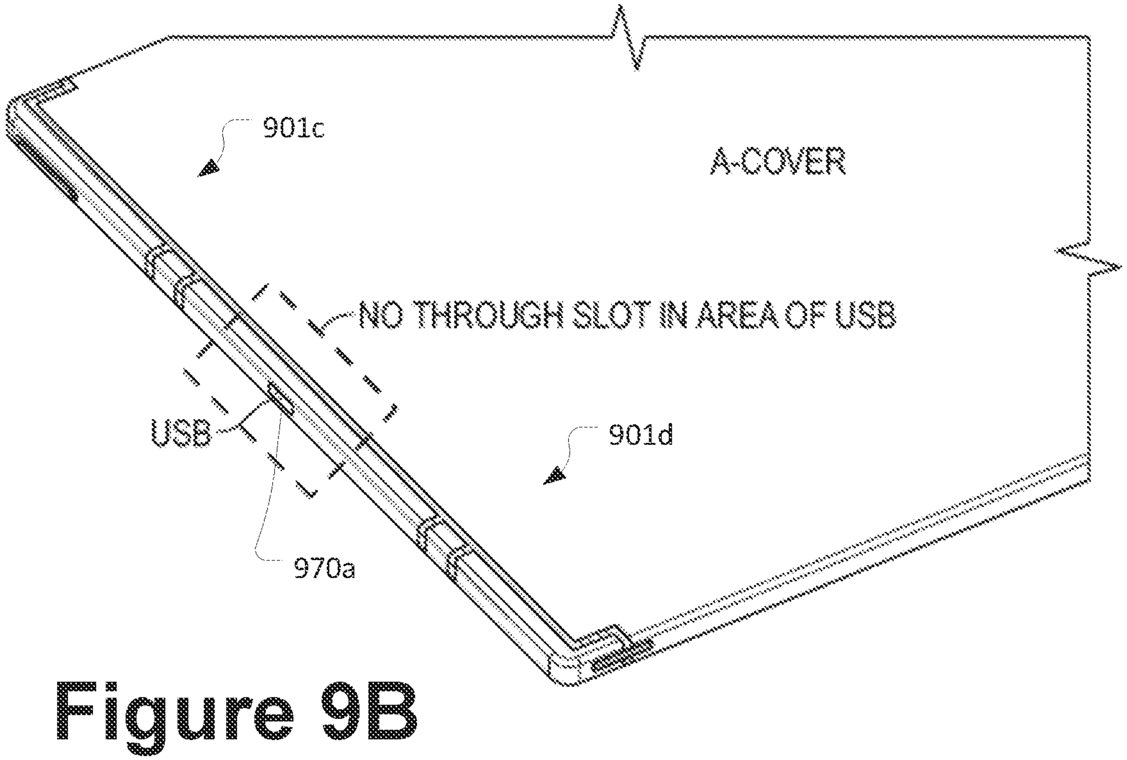
Figure 9C:
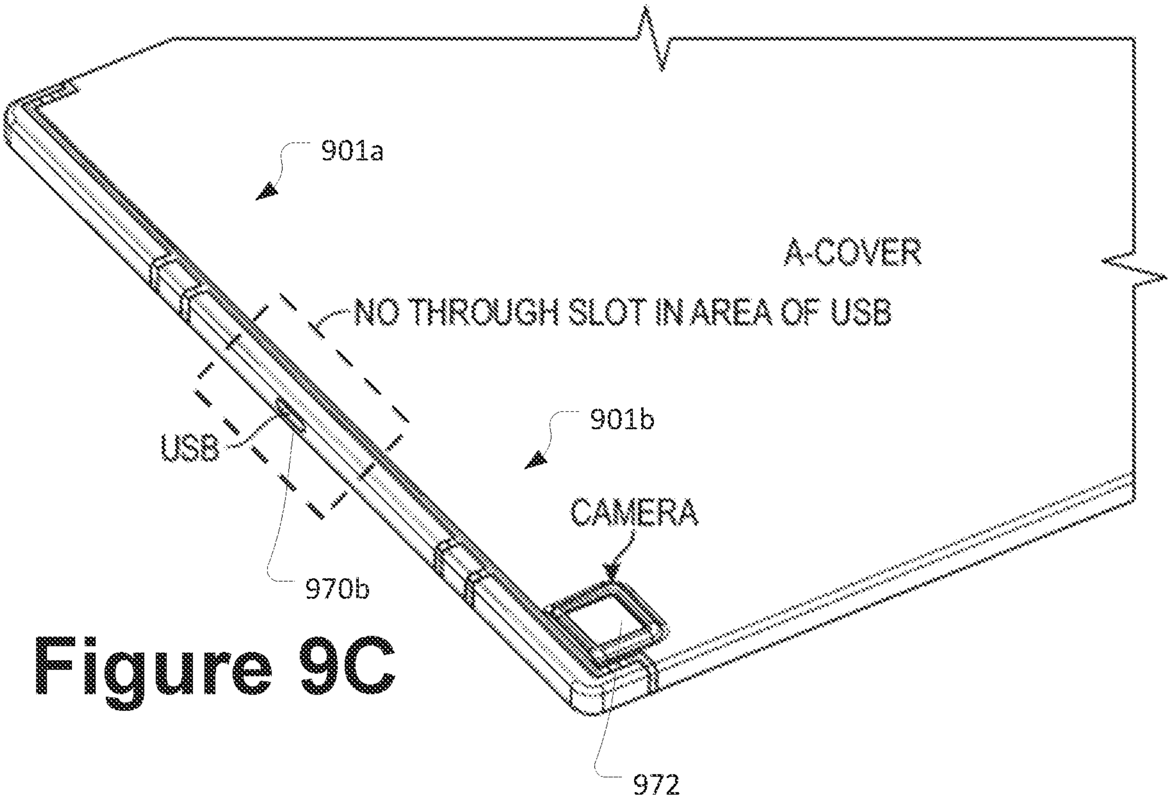
Figure 9D:
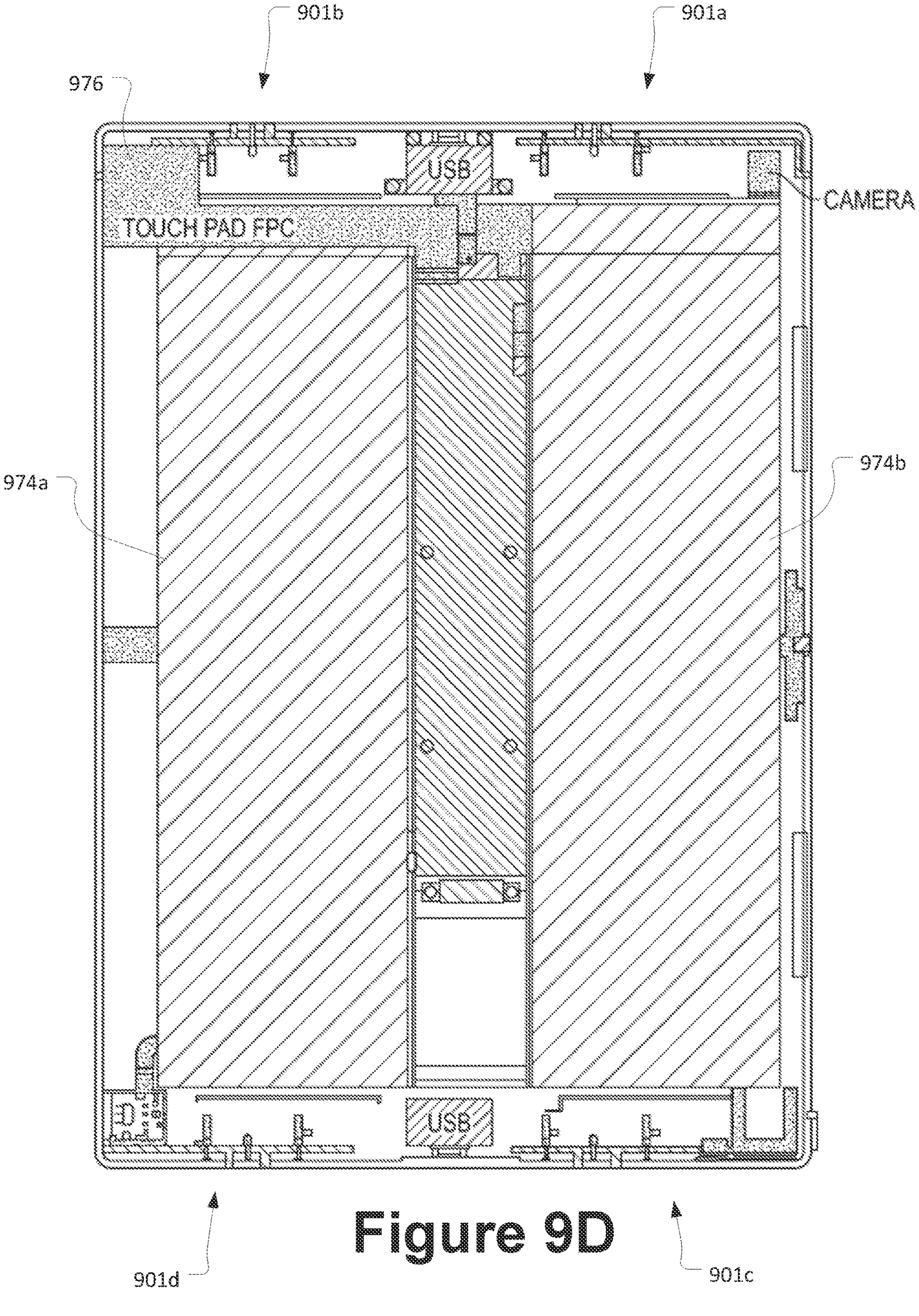
Figure 9E:
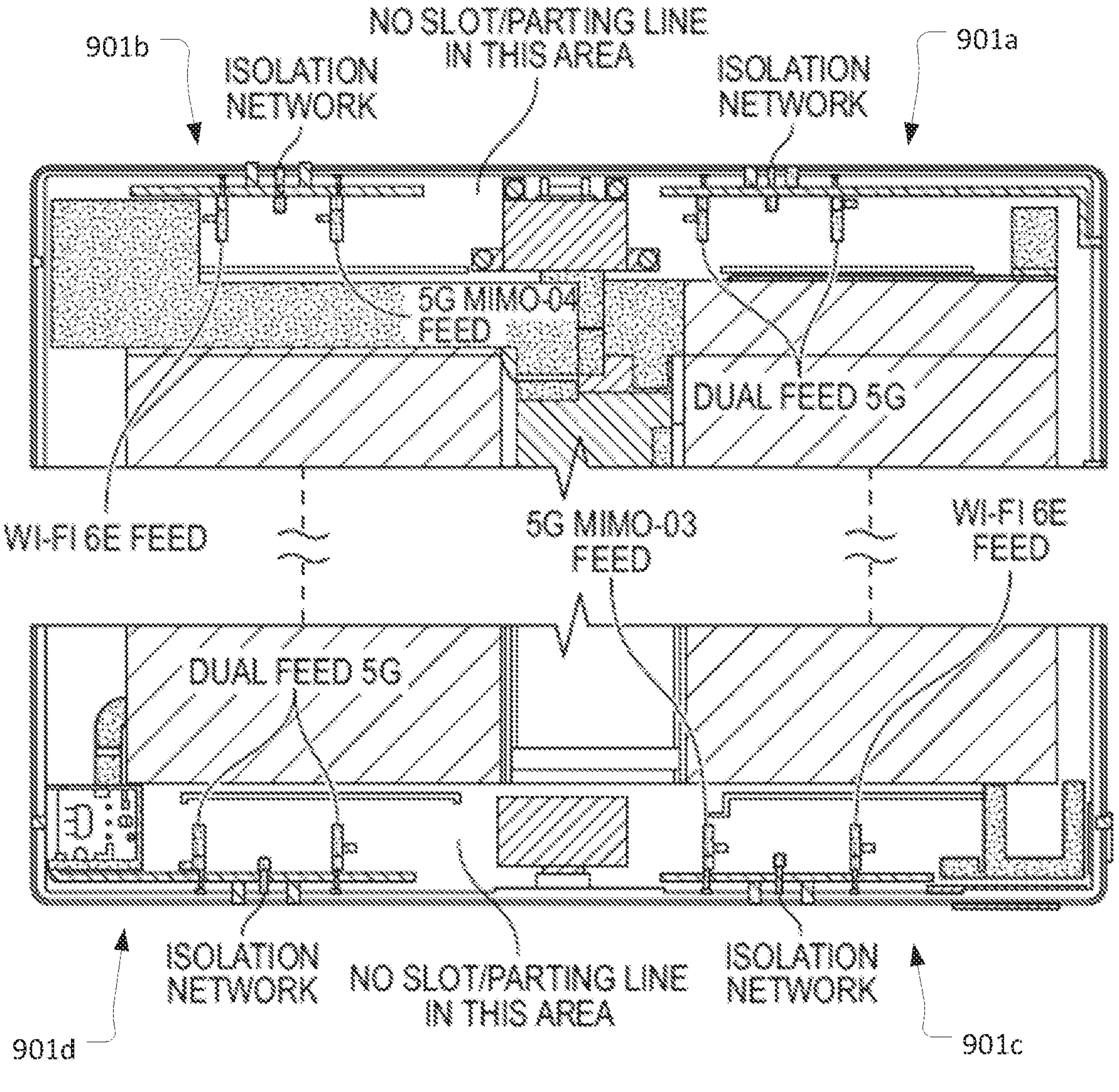

FIGS. 9A-9E illustrate an example tablet computing device 900 (referred to as "tablet 900") in accordance with various embodiments. For example, FIG. 9A is a top view from a rear cover (A-cover) side of the tablet 900. FIGS. 9B and 9C are perspective views of respective ends of the tablet 900 from the rear cover side. FIG. 9D is a top view from the display side of the tablet 900, showing internal components of the tablet 900. FIG. 9E shows close-up views of end regions of the view shown in FIG. 9D.

The computing device 900 may include a plurality of antenna assemblies 901*a-d*, and each antenna assembly 901*a-d* may include one or more antennas 904*a-h*. For instance, in the example implementation shown in FIG. 9, the tablet 900 includes four antenna assemblies 901*a-d* that each include two antennas 902*a-h*.

The antennas 902*a-h* may be at least partially implemented in a metal chassis 905 of the tablet 900, e.g., as metal split antennas. For example, the antennas 902*a-h* may include respective conductive antenna portions 910*a-h* that are implemented by the chassis 905. The antenna assemblies 901*a-d* may further include respective isolation networks 908*a-d*. The isolation networks 908*a-d* may include respective conductive structures 918*a-d* between the conductive antenna portions 910*a-h* of the respective antenna assemblies 901*a-d*.

In various embodiments, the antenna assemblies 901*a-d* may include respective parting lines 934*a-d* in the metal chassis 905 to form the conductive antenna portions 910*a-h* and/or conductive structures 918*a-d*. The parting lines 934*a-d* may be a slot in the metal chassis 905, which may include a plastic or other non-conductive material. In some embodiments, from the rear cover side of the tablet 900 (e.g., as shown in FIGS. 9A-9C), it may appear that the parting lines 934*a-d* continue between different antenna assemblies 901*a-d*. However, as shown in FIGS. 9D and 9E, the parting line 934*a-d* (e.g., slot) may not extend all the way through the chassis 905 in one or more regions 907. In some embodiments, another component of the tablet 900, such as a communication and/or power interface (e.g., a Universal Serial Bus® (USB) port 970*a-b*, a Thunderbolt® port, and/or another suitable port), a camera 972, a memory card reader, and/or another component may be in one or more of the regions 907. The absence of the parting line 934*a-d* through the chassis 905 in the regions 907 may prevent performance degradation for the other component(s).

In various embodiments, the tablet 900 may include antenna assemblies 901*a-d* with any suitable combination of configurations. For example, as shown in FIGS. 9A-9E, the antenna assembly 901*a* may be a main dual feed 5G antenna assembly; antenna assembly 901*b* may be a WiFi 6E main/5G MIMO 04 combo antenna assembly; antenna assembly 901*c* may be a WiFi 6E auxiliary/5G MIMO 03 combo antenna assembly; and antenna assembly 901*d* may be an auxiliary dual feed 5G antenna. It will be apparent that other combinations of antenna assemblies 901*a-d* and/or antennas 902*a-h* may be used in other implementations.

The tablet 900 may any suitable combination of additional components, such as batteries 974*a-b* and/or touch pad FPC 976 (for a touch pad display, not shown), as best seen in FIG. 9D.

Figure 10:
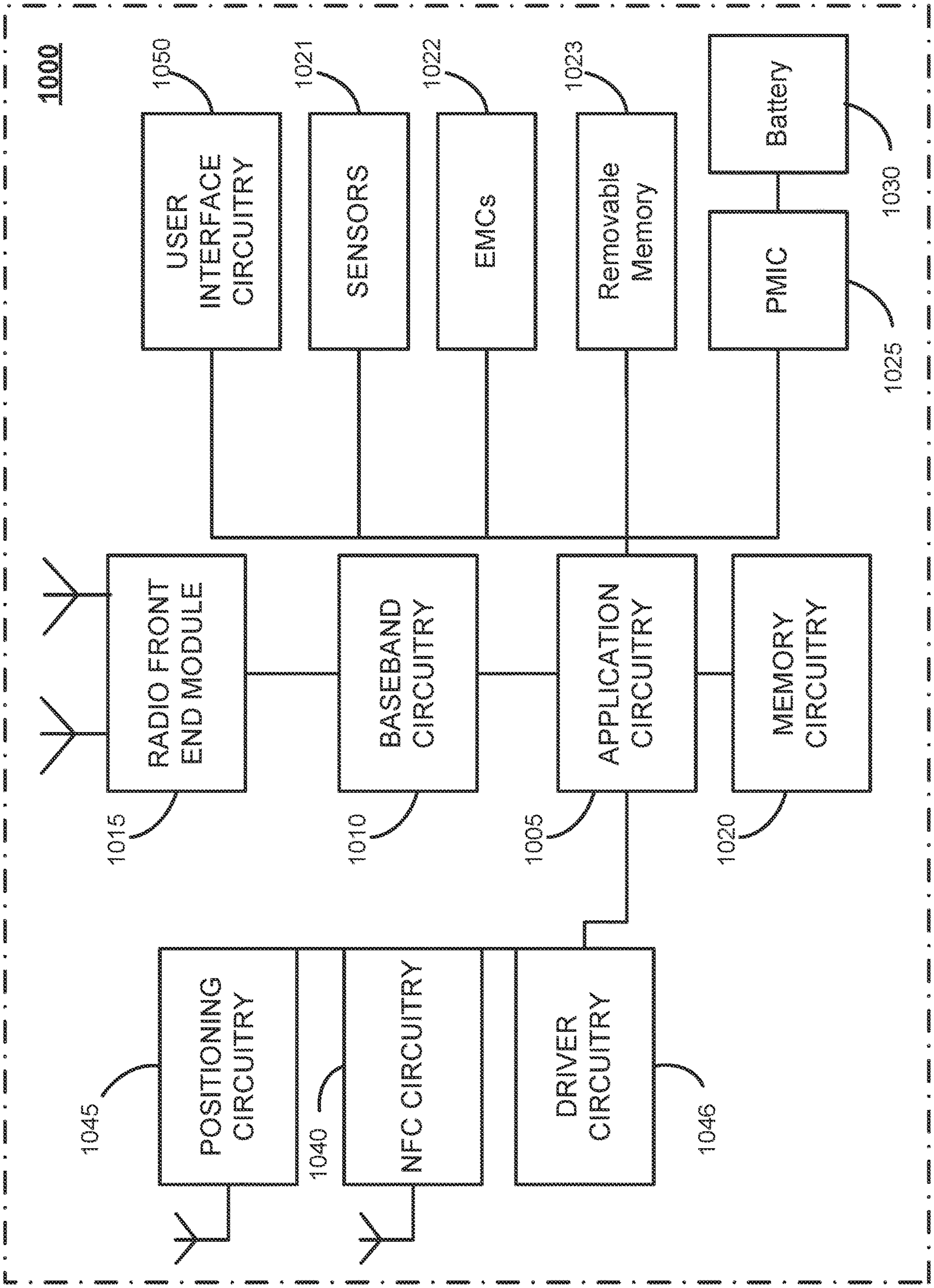
FIG. 10 illustrates an example of a computer platform in accordance with various embodiments.

FIG. 10 illustrates an example of a platform 1000 (or "device 1000") in accordance with various embodiments. The platform 1000 may include one or more antenna assemblies as discussed herein. For example, the platform 1000 may correspond to the laptop computer 450 of FIGS. 4B-4D, the laptop computer 550 of FIG. 5, the tablet 900 of FIG. 9, and/or another suitable computing device capable of communicating over one or more wireless communication protocols.

The platform 1000 may include any combinations of the components shown in the example. The components of platform 1000 may be implemented as integrated circuits (ICs), portions thereof, discrete electronic devices, or other modules, logic, hardware, software, firmware, or a combination thereof adapted in the computer platform 1000, or as components otherwise incorporated within a chassis of a larger system. The block diagram of FIG. 10 is intended to show a high level view of components of the computer platform 1000. However, some of the components shown may be omitted, additional components may be present, and different arrangement of the components shown may occur in other implementations.

Application circuitry 1005 includes circuitry such as, but not limited to one or more processors (or processor cores), cache memory, and one or more of LDOs, interrupt controllers, serial interfaces such as SPI, I2C or universal programmable serial interface module, RTC, timer-counters including interval and watchdog timers, general purpose I/O, memory card controllers such as SD MMC or similar, USB interfaces, MIPI interfaces, and JTAG test access ports. The processors (or cores) of the application circuitry 1005 may be coupled with or may include memory/storage elements and may be configured to execute instructions stored in the memory/storage to enable various applications or operating systems to run on the system 1000. In some implementations, the memory/storage elements may be on-chip memory circuitry, which may include any suitable volatile and/or non-volatile memory, such as DRAM, SRAM, EPROM, EEPROM, Flash memory, solid-state memory, and/or any other type of memory device technology, such as those discussed herein.

The processor(s) of application circuitry 1005 may include, for example, one or more processor cores, one or more application processors, one or more GPUs, one or more RISC processors, one or more ARM processors, one or more CISC processors, one or more DSP, one or more FPGAs, one or more PLDs, one or more ASICs, one or more microprocessors or controllers, a multithreaded processor, an ultra-low voltage processor, an embedded processor, some other known processing element, or any suitable combination thereof. In some embodiments, the application circuitry 1005 may comprise, or may be, a special-purpose processor/controller to operate according to the various embodiments herein.

As examples, the processor(s) of application circuitry 1005 may include an Intel® Architecture Core™ based processor, such as a Quark™, an Atom™, an i3, an i5, an i7, or an MCU-class processor, or another such processor available from Intel® Corporation, Santa Clara, CA The processors of the application circuitry 1005 may also be one or more of Advanced Micro Devices (AMD) Ryzen® processor(s) or Accelerated Processing Units (APUs); A5-A9 processor(s) from Apple® Inc., Snapdragon™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; or the like. In some implementations, the application circuitry 1005 may be a part of a system on a chip (SoC) in which the application circuitry 1005 and other components are formed into a single integrated circuit, or a single package, such as the Edison™ or Galileo™ SoC boards from Intel® Corporation.

Additionally or alternatively, application circuitry 1005 may include circuitry such as, but not limited to, one or more a field-programmable devices (FPDs) such as FPGAs and the like; programmable logic devices (PLDs) such as complex PLDs (CPLDs), high-capacity PLDs (HCPLDs), and the like; ASICs such as structured ASICs and the like; programmable SoCs (PSoCs); and the like. In such embodiments, the circuitry of application circuitry 1005 may comprise logic blocks or logic fabric, and other interconnected resources that may be programmed to perform various functions, such as the procedures, methods, functions, etc. of the various embodiments discussed herein. In such embodiments, the circuitry of application circuitry 1005 may include memory cells (e.g., erasable programmable read-only memory (EPROM), electrically erasable programmable read-only memory (EEPROM), flash memory, static memory (e.g., static random access memory (SRAM), anti-fuses, etc.)) used to store logic blocks, logic fabric, data, etc. in look-up tables (LUTs) and the like.

The baseband circuitry 1010 may be implemented, for example, as a solder-down substrate including one or more integrated circuits, a single packaged integrated circuit soldered to a main circuit board or a multi-chip module containing two or more integrated circuits. The various hardware electronic elements of baseband circuitry 1010 are discussed infra with regard to FIG. 11.

The RFEMs 1015 may comprise a millimeter wave (mmWave) RFEM and one or more sub-mmWave radio frequency integrated circuits (RFICs). In some implementations, the one or more sub-mmWave RFICs may be physically separated from the mmWave RFEM. The RFICs may include connections to one or more antennas or antenna arrays (see e.g., antenna array 1111 of FIG. 11 infra), and the RFEM may be connected to multiple antennas. In alternative implementations, both mmWave and sub-mmWave radio functions may be implemented in the same physical RFEM 1015, which incorporates both mmWave antennas and sub-mmWave.

The memory circuitry 1020 may include any number and type of memory devices used to provide for a given amount of system memory. As examples, the memory circuitry 1020 may include one or more of volatile memory including random access memory (RAM), dynamic RAM (DRAM) and/or synchronous dynamic RAM (SDRAM), and nonvolatile memory (NVM) including high-speed electrically erasable memory (commonly referred to as Flash memory), phase change random access memory (PRAM), magnetoresistive random access memory (MRAM), etc. The memory circuitry 1020 may be developed in accordance with a Joint Electron Devices Engineering Council (JEDEC) low power double data rate (LPDDR)-based design, such as LPDDR2, LPDDR3, LPDDR4, or the like. Memory circuitry 1020 may be implemented as one or more of solder down packaged integrated circuits, single die package (SDP), dual die package (DDP) or quad die package (Q17P), socketed memory modules, dual inline memory modules (DIMMs) including microDIMMs or MiniDIMMs, and/or soldered onto a motherboard via a ball grid array (BGA). In low power implementations, the memory circuitry 1020 may be on-die memory or registers associated with the application circuitry 1005. To provide for persistent storage of information such as data, applications, operating systems and so forth, memory circuitry 1020 may include one or more mass storage devices, which may include, inter alia, a solid state disk drive (SSDD), hard disk drive (HDD), a micro HDD, resistance change memories, phase change memories, holographic memories, or chemical memories, among others. For example, the computer platform 1000 may incorporate the three-dimensional (3D) cross-point (XPOINT) memories from Intel® and Micron®.

Removable memory circuitry 1023 may include devices, circuitry, enclosures/housings, ports or receptacles, etc. used to couple portable data storage devices with the platform 1000. These portable data storage devices may be used for mass storage purposes, and may include, for example, flash memory cards (e.g., Secure Digital (SD) cards, microSD cards, xD picture cards, and the like), and USB flash drives, optical discs, external HDDs, and the like.

The platform 1000 may also include interface circuitry (not shown) that is used to connect external devices with the platform 1000. The external devices connected to the platform 1000 via the interface circuitry include sensor circuitry 1021 and electro-mechanical components (EMCs) 1022, as well as removable memory devices coupled to removable memory circuitry 1023.

The sensor circuitry 1021 include devices, modules, or subsystems whose purpose is to detect events or changes in its environment and send the information (sensor data) about the detected events to some other a device, module, subsystem, etc. Examples of such sensors include, inter alia, inertia measurement units (IMUs) comprising accelerometers, gyroscopes, and/or magnetometers; microelectromechanical systems (MEMS) or nanoelectromechanical systems (NEMS) comprising 3-axis accelerometers, 3-axis gyroscopes, and/or magnetometers; level sensors; flow sensors; temperature sensors (e.g., thermistors); pressure sensors; barometric pressure sensors; gravimeters; altimeters; image capture devices (e.g., cameras or lensless apertures); light detection and ranging (LiDAR) sensors; proximity sensors (e.g., infrared radiation detector and the like), depth sensors, ambient light sensors, ultrasonic transceivers; microphones or other like audio capture devices; etc.

EMCs 1022 include devices, modules, or subsystems whose purpose is to enable platform 1000 to change its state, position, and/or orientation, or move or control a mechanism or (sub)system. Additionally, EMCs 1022 may be configured to generate and send messages/signalling to other components of the platform 1000 to indicate a current state of the EMCs 1022. Examples of the EMCs 1022 include one or more power switches, relays including electromechanical relays (EMRs) and/or solid state relays (SSRs), actuators (e.g., valve actuators, etc.), an audible sound generator, a visual warning device, motors (e.g., DC motors, stepper motors, etc.), wheels, thrusters, propellers, claws, clamps, hooks, and/or other like electro-mechanical components. In embodiments, platform 1000 is configured to operate one or more EMCs 1022 based on one or more captured events and/or instructions or control signals received from a service provider and/or various clients.

In some implementations, the interface circuitry may connect the platform 1000 with positioning circuitry 1045. The positioning circuitry 1045 includes circuitry to receive and decode signals transmitted/broadcasted by a positioning network of a GNSS. Examples of navigation satellite constellations (or GNSS) include United States' GPS, Russia's GLONASS, the European Union's Galileo system, China's BeiDou Navigation Satellite System, a regional navigation system or GNSS augmentation system (e.g., NAVIC), Japan's QZSS, France's DORIS, etc.), or the like. The positioning circuitry 1045 comprises various hardware elements (e.g., including hardware devices such as switches, filters, amplifiers, antenna elements, and the like to facilitate OTA communications) to communicate with components of a positioning network, such as navigation satellite constellation nodes. In some embodiments, the positioning circuitry 1045 may include a Micro-PNT IC that uses a master timing clock to perform position tracking/estimation without GNSS assistance. The positioning circuitry 1045 may also be part of, or interact with, the baseband circuitry 1010 and/or RFEMs 1015 to communicate with the nodes and components of the positioning network. The positioning circuitry 1045 may also provide position data and/or time data to the application circuitry 1005, which may use the data to synchronize operations with various infrastructure (e.g., radio base stations), for turn-by-turn navigation applications, or the like In some implementations, the interface circuitry may connect the platform 1000 with Near-Field Communication (NFC) circuitry 1040. NFC circuitry 1040 is configured to provide contactless, short-range communications based on radio frequency identification (RFID) standards, wherein magnetic field induction is used to enable communication between NFC circuitry 1040 and NFC-enabled devices external to the platform 1000 (e.g., an "NFC touchpoint"). NFC circuitry 1040 comprises an NFC controller coupled with an antenna element and a processor coupled with the NFC controller. The NFC controller may be a chip/IC providing NFC functionalities to the NFC circuitry 1040 by executing NFC controller firmware and an NFC stack. The NFC stack may be executed by the processor to control the NFC controller, and the NFC controller firmware may be executed by the NFC controller to control the antenna element to emit short-range RF signals. The RF signals may power a passive NFC tag (e.g., a microchip embedded in a sticker or wristband) to transmit stored data to the NFC circuitry 1040, or initiate data transfer between the NFC circuitry 1040 and another active NFC device (e.g., a smartphone or an NFC-enabled POS terminal) that is proximate to the platform 1000.

The driver circuitry 1046 may include software and hardware elements that operate to control particular devices that are embedded in the platform 1000, attached to the platform 1000, or otherwise communicatively coupled with the platform 1000. The driver circuitry 1046 may include individual drivers allowing other components of the platform 1000 to interact with or control various input/output (I/O) devices that may be present within, or connected to, the platform 1000. For example, driver circuitry 1046 may include a display driver to control and allow access to a display device, a touchscreen driver to control and allow access to a touchscreen interface of the platform 1000, sensor drivers to obtain sensor readings of sensor circuitry 1021 and control and allow access to sensor circuitry 1021, EMC drivers to obtain actuator positions of the EMCs 1022 and/or control and allow access to the EMCs 1022, a camera driver to control and allow access to an embedded image capture device, audio drivers to control and allow access to one or more audio devices.

The power management integrated circuitry (PMIC) 1025 (also referred to as "power management circuitry 1025") may manage power provided to various components of the platform 1000. In particular, with respect to the baseband circuitry 1010, the PMIC 1025 may control power-source selection, voltage scaling, battery charging, or DC-to-DC conversion. The PMIC 1025 may often be included when the platform 1000 is capable of being powered by a battery 1030.

In some embodiments, the PMIC 1025 may control, or otherwise be part of, various power saving mechanisms of the platform 1000. For example, if the platform 1000 is in an RRC_Connected state, where it is still connected to the RAN node as it expects to receive traffic shortly, then it may enter a state known as Discontinuous Reception Mode (DRX) after a period of inactivity. During this state, the platform 1000 may power down for brief intervals of time and thus save power. If there is no data traffic activity for an extended period of time, then the platform 1000 may transition off to an RRC_Idle state, where it disconnects from the network and does not perform operations such as channel quality feedback, handover, etc. The platform 1000 goes into a very low power state and it performs paging where again it periodically wakes up to listen to the network and then powers down again. The platform 1000 may not receive data in this state; in order to receive data, it must transition back to RRC_Connected state. An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

A battery 1030 may power the platform 1000, although in some examples the platform 1000 may be mounted deployed in a fixed location, and may have a power supply coupled to an electrical grid. The battery 1030 may be a lithium ion battery, a metal-air battery, such as a zinc-air battery, an aluminum-air battery, a lithium-air battery, and the like. In some implementations, such as in V2X applications, the battery 1030 may be a typical lead-acid automotive battery.

In some implementations, the battery 1030 may be a "smart battery," which includes or is coupled with a Battery Management System (BMS) or battery monitoring integrated circuitry. The BMS may be included in the platform 1000 to track the state of charge (SoCh) of the battery 1030. The BMS may be used to monitor other parameters of the battery 1030 to provide failure predictions, such as the state of health (SoH) and the state of function (SoF) of the battery 1030. The BMS may communicate the information of the battery 1030 to the application circuitry 1005 or other components of the platform 1000. The BMS may also include an analog-to-digital (ADC) convertor that allows the application circuitry 1005 to directly monitor the voltage of the battery 1030 or the current flow from the battery 1030. The battery parameters may be used to determine actions that the platform 1000 may perform, such as transmission frequency, network operation, sensing frequency, and the like.

A power block, or other power supply coupled to an electrical grid may be coupled with the BMS to charge the battery 1030. In some examples, the power block 1030 may be replaced with a wireless power receiver to obtain the power wirelessly, for example, through a loop antenna in the computer platform 1000. In these examples, a wireless battery charging circuit may be included in the BMS. The specific charging circuits chosen may depend on the size of the battery 1030, and thus, the current required. The charging may be performed using the Airfuel standard promulgated by the Airfuel Alliance, the Qi wireless charging standard promulgated by the Wireless Power Consortium, or the Rezence charging standard promulgated by the Alliance for Wireless Power, among others.

User interface circuitry 1050 includes various input/output (I/O) devices present within, or connected to, the platform 1000, and includes one or more user interfaces designed to enable user interaction with the platform 1000 and/or peripheral component interfaces designed to enable peripheral component interaction with the platform 1000. The user interface circuitry 1050 includes input device circuitry and output device circuitry. Input device circuitry includes any physical or virtual means for accepting an input including, inter alia, one or more physical or virtual buttons (e.g., a reset button), a physical keyboard, keypad, mouse, touchpad, touchscreen, microphones, scanner, headset, and/or the like. The output device circuitry includes any physical or virtual means for showing information or otherwise conveying information, such as sensor readings, actuator position(s), or other like information. Output device circuitry may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Chrystal Displays (LCD), LED displays, quantum dot displays, projectors, etc.), with the output of characters, graphics, multimedia objects, and the like being generated or produced from the operation of the platform 1000. The output device circuitry may also include speakers or other audio emitting devices, printer(s), and/or the like. In some embodiments, the sensor circuitry 1021 may be used as the input device circuitry (e.g., an image capture device, motion capture device, or the like) and one or more EMCs may be used as the output device circuitry (e.g., an actuator to provide haptic feedback or the like). In another example, NFC circuitry comprising an NFC controller coupled with an antenna element and a processing device may be included to read electronic tags and/or connect with another NFC-enabled device. Peripheral component interfaces may include, but are not limited to, a non-volatile memory port, a USB port, an audio jack, a power supply interface, etc.

Although not shown, the components of platform 1000 may communicate with one another using a suitable bus or interconnect (IX) technology, which may include any number of technologies, including ISA, EISA, PCI, PCIx, PCIe, a Time-Trigger Protocol (TTP) system, a FlexRay system, or any number of other technologies. The bus/IX may be a proprietary bus/IX, for example, used in a SoC based system. Other bus/IX systems may be included, such as an I2C interface, an SPI interface, point-to-point interfaces, and a power bus, among others.

Figure 11:
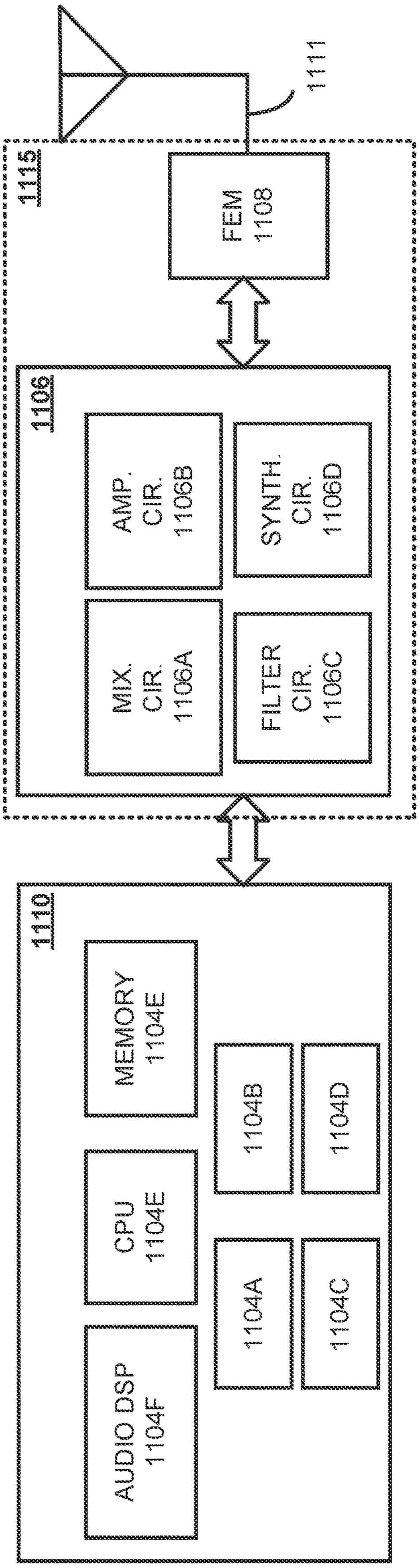
FIG. 11 illustrates example components of baseband circuitry and radio front end modules in accordance with various embodiments.

FIG. 11 illustrates example components of baseband circuitry 1110 and radio front end modules (RFEM) 1115 in accordance with various embodiments. The baseband circuitry 1110 corresponds to the baseband circuitry 1010 of FIG. 10. The RFEM 1115 corresponds to the RFEM 1015 of FIG. 10. As shown, the RFEMs 1115 may include Radio Frequency (RF) circuitry 1106, front-end module (FEM) circuitry 1108, antenna array 1111 coupled together at least as shown.

The baseband circuitry 1110 includes circuitry and/or control logic configured to carry out various radio/network protocol and radio control functions that enable communication with one or more radio networks via the RF circuitry 1106. The radio control functions may include, but are not limited to, signal modulation/demodulation, encoding/decoding, radio frequency shifting, etc. In some embodiments, modulation/demodulation circuitry of the baseband circuitry 1110 may include Fast-Fourier Transform (FFT), precoding, or constellation mapping/demapping functionality. In some embodiments, encoding/decoding circuitry of the baseband circuitry 1110 may include convolution, tail-biting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments. The baseband circuitry 1110 is configured to process baseband signals received from a receive signal path of the RF circuitry 1106 and to generate baseband signals for a transmit signal path of the RF circuitry 1106. The baseband circuitry 1110 is configured to interface with application circuitry 1005 (see FIG. 10) for generation and processing of the baseband signals and for controlling operations of the RF circuitry 1106. The baseband circuitry 1110 may handle various radio control functions.

The aforementioned circuitry and/or control logic of the baseband circuitry 1110 may include one or more single or multi-core processors. For example, the one or more processors may include a 3G baseband processor 1104A, a 4G/LTE baseband processor 1104B, a 5G/NR baseband processor 1104C, or some other baseband processor(s) 1104D for other existing generations, generations in development or to be developed in the future (e.g., sixth generation (6G), etc.). In other embodiments, some or all of the functionality of baseband processors 1104A-D may be included in modules stored in the memory 1104G and executed via a Central Processing Unit (CPU) 1104E. In other embodiments, some or all of the functionality of baseband processors 1104A-D may be provided as hardware accelerators (e.g., FPGAs, ASICs, etc.) loaded with the appropriate bit streams or logic blocks stored in respective memory cells. In various embodiments, the memory 1104G may store program code of a real-time OS (RTOS), which when executed by the CPU 1104E (or other baseband processor), is to cause the CPU 1104E (or other baseband processor) to manage resources of the baseband circuitry 1110, schedule tasks, etc. Examples of the RTOS may include Operating System Embedded (OSE)™ provided by Enea®, Nucleus RTOS™ provided by Mentor Graphics®, Versatile Real-Time Executive (VRTX) provided by Mentor Graphics®, ThreadX™ provided by Express Logic®, FreeRTOS, REX OS provided by Qualcomm®, OKL4 provided by Open Kernel (OK) Labs®, or any other suitable RTOS, such as those discussed herein. In addition, the baseband circuitry 1110 includes one or more audio digital signal processor(s) (DSP) 1104F. The audio DSP(s) 1104F include elements for compression/decompression and echo cancellation and may include other suitable processing elements in other embodiments.

In some embodiments, each of the processors 1104A-1104E include respective memory interfaces to send/receive data to/from the memory 1104G. The baseband circuitry 1110 may further include one or more interfaces to communicatively couple to other circuitries/devices, such as an interface to send/receive data to/from memory external to the baseband circuitry 1110; an application circuitry interface to send/receive data to/from the application circuitry 1005 of FIG. 10); an RF circuitry interface to send/receive data to/from RF circuitry 1106 of FIG. 11; a wireless hardware connectivity interface to send/receive data to/from one or more wireless hardware elements (e.g., Near Field Communication (NFC) components, Bluetooth/Bluetooth® Low Energy components, Wi-Fi® components, and/or the like); and a power management interface to send/receive power or control signals to/from the PMIC 1025.

In alternate embodiments (which may be combined with the above described embodiments), baseband circuitry 1110 comprises one or more digital baseband systems, which are coupled with one another via an interconnect subsystem and to a CPU subsystem, an audio subsystem, and an interface subsystem. The digital baseband subsystems may also be coupled to a digital baseband interface and a mixed-signal baseband subsystem via another interconnect subsystem. Each of the interconnect subsystems may include a bus system, point-to-point connections, network-on-chip (NOC) structures, and/or some other suitable bus or interconnect technology, such as those discussed herein. The audio subsystem may include DSP circuitry, buffer memory, program memory, speech processing accelerator circuitry, data converter circuitry such as analog-to-digital and digital-to-analog converter circuitry, analog circuitry including one or more of amplifiers and filters, and/or other like components. In an aspect of the present disclosure, baseband circuitry 1110 may include protocol processing circuitry with one or more instances of control circuitry (not shown) to provide control functions for the digital baseband circuitry and/or radio frequency circuitry (e.g., the radio front end modules 1115).

Although not shown by FIG. 11, in some embodiments, the baseband circuitry 1110 includes individual processing device(s) to operate one or more wireless communication protocols (e.g., a "multi-protocol baseband processor" or "protocol processing circuitry") and individual processing device(s) to implement PHY layer functions. In these embodiments, the PHY layer functions include the aforementioned radio control functions. In these embodiments, the protocol processing circuitry operates or implements various protocol layers/entities of one or more wireless communication protocols. In a first example, the protocol processing circuitry may operate LTE protocol entities and/or 5G/NR protocol entities when the baseband circuitry 1110 and/or RF circuitry 1106 are part of mmWave communication circuitry or some other suitable cellular communication circuitry. In the first example, the protocol processing circuitry would operate MAC, RLC, PDCP, SDAP, RRC, and NAS functions. In a second example, the protocol processing circuitry may operate one or more IEEE-based protocols when the baseband circuitry 1110 and/or RF circuitry 1106 are part of a Wi-Fi communication system. In the second example, the protocol processing circuitry would operate Wi-Fi MAC and logical link control (LLC) functions. The protocol processing circuitry may include one or more memory structures (e.g., 1104G) to store program code and data for operating the protocol functions, as well as one or more processing cores to execute the program code and perform various operations using the data. The baseband circuitry 1110 may also support radio communications for more than one wireless protocol.

The various hardware elements of the baseband circuitry 1110 discussed herein may be implemented, for example, as a solder-down substrate including one or more integrated circuits (ICs), a single packaged IC soldered to a main circuit board or a multi-chip module containing two or more ICs. In one example, the components of the baseband circuitry 1110 may be suitably combined in a single chip or chipset, or disposed on a same circuit board. In another example, some or all of the constituent components of the baseband circuitry 1110 and RF circuitry 1106 may be implemented together such as, for example, a system on a chip (SoC) or System-in-Package (SiP). In another example, some or all of the constituent components of the baseband circuitry 1110 may be implemented as a separate SoC that is communicatively coupled with and RF circuitry 1106 (or multiple instances of RF circuitry 1106). In yet another example, some or all of the constituent components of the baseband circuitry 1110 and the application circuitry 1005 may be implemented together as individual SoCs mounted to a same circuit board (e.g., a "multi-chip package").

In some embodiments, the baseband circuitry 1110 may provide for communication compatible with one or more radio technologies. For example, in some embodiments, the baseband circuitry 1110 may support communication with an E-UTRAN or other WMAN, a WLAN, a WPAN. Embodiments in which the baseband circuitry 1110 is configured to support radio communications of more than one wireless protocol may be referred to as multi-mode baseband circuitry.

RF circuitry 1106 may enable communication with wireless networks using modulated electromagnetic radiation through a non-solid medium. In various embodiments, the RF circuitry 1106 may include switches, filters, amplifiers, etc. to facilitate the communication with the wireless network. RF circuitry 1106 may include a receive signal path, which may include circuitry to down-convert RF signals received from the FEM circuitry 1108 and provide baseband signals to the baseband circuitry 1110. RF circuitry 1106 may also include a transmit signal path, which may include circuitry to up-convert baseband signals provided by the baseband circuitry 1110 and provide RF output signals to the FEM circuitry 1108 for transmission.

In some embodiments, the receive signal path of the RF circuitry 1106 may include mixer circuitry **1106*a*, amplifier circuitry 1106*b* and filter circuitry 1106*c*. In some embodiments, the transmit signal path of the RF circuitry 1106 may include filter circuitry 1106*c* and mixer circuitry 1106*a*. RF circuitry 1106 may also include synthesizer circuitry 1106*d* for synthesizing a frequency for use by the mixer circuitry 1106*a* of the receive signal path and the transmit signal path. In some embodiments, the mixer circuitry 1106*a* of the receive signal path may be configured to down-convert RF signals received from the FEM circuitry 1108 based on the synthesized frequency provided by synthesizer circuitry 1106*d*. The amplifier circuitry 1106*b* may be configured to amplify the down-converted signals and the filter circuitry 1106*c* may be a low-pass filter (LPF) or band-pass filter (BPF) configured to remove unwanted signals from the down-converted signals to generate output baseband signals. Output baseband signals may be provided to the baseband circuitry 1110 for further processing. In some embodiments, the output baseband signals may be zero-frequency baseband signals, although this is not a requirement. In some embodiments, mixer circuitry 1106***a* of the receive signal path may comprise passive mixers, although the scope of the embodiments is not limited in this respect.

In some embodiments, the mixer circuitry 1106*a* of the transmit signal path may be configured to up-convert input baseband signals based on the synthesized frequency provided by the synthesizer circuitry 1106*d* to generate RF output signals for the FEM circuitry 1108. The baseband signals may be provided by the baseband circuitry 1110 and may be filtered by filter circuitry 1106*c*.

In some embodiments, the mixer circuitry 1106*a* of the receive signal path and the mixer circuitry 1106*a* of the transmit signal path may include two or more mixers and may be arranged for quadrature downconversion and upconversion, respectively. In some embodiments, the mixer circuitry 1106*a* of the receive signal path and the mixer circuitry 1106*a* of the transmit signal path may include two or more mixers and may be arranged for image rejection (e.g., Hartley image rejection). In some embodiments, the mixer circuitry 1106*a* of the receive signal path and the mixer circuitry 1106*a* of the transmit signal path may be arranged for direct downconversion and direct upconversion, respectively. In some embodiments, the mixer circuitry 1106*a* of the receive signal path and the mixer circuitry 1106*a* of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 1106 may include analog-to-digital converter (ADC) and digital-to-analog converter (DAC) circuitry and the baseband circuitry 1110 may include a digital baseband interface to communicate with the RF circuitry 1106.

In some dual-mode embodiments, a separate radio IC circuitry may be provided for processing signals for each spectrum, although the scope of the embodiments is not limited in this respect.

In some embodiments, the synthesizer circuitry 1106*d* may be a fractional-N synthesizer or a fractional N/N+1 synthesizer, although the scope of the embodiments is not limited in this respect as other types of frequency synthesizers may be suitable. For example, synthesizer circuitry 1106*d* may be a delta-sigma synthesizer, a frequency multiplier, or a synthesizer comprising a phase-locked loop with a frequency divider.

The synthesizer circuitry 1106*d* may be configured to synthesize an output frequency for use by the mixer circuitry 1106*a* of the RF circuitry 1106 based on a frequency input and a divider control input. In some embodiments, the synthesizer circuitry 1106*d* may be a fractional N/N+1 synthesizer.

In some embodiments, frequency input may be provided by a voltage controlled oscillator (VCO), although that is not a requirement. Divider control input may be provided by either the baseband circuitry 1110 or the application circuitry 1005 depending on the desired output frequency. In some embodiments, a divider control input (e.g., N) may be determined from a look-up table based on a channel indicated by the application circuitry 1005.

Synthesizer circuitry 1106*d* of the RF circuitry 1106 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 1106*d* may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 1106 may include an IQ/polar converter.

FEM circuitry 1108 may include a receive signal path, which may include circuitry configured to operate on RF signals received from antenna array 1111, amplify the received signals and provide the amplified versions of the received signals to the RF circuitry 1106 for further processing. FEM circuitry 1108 may also include a transmit signal path, which may include circuitry configured to amplify signals for transmission provided by the RF circuitry 1106 for transmission by one or more of antenna elements of antenna array 1111. In various embodiments, the amplification through the transmit or receive signal paths may be done solely in the RF circuitry 1106, solely in the FEM circuitry 1108, or in both the RF circuitry 1106 and the FEM circuitry 1108.

In some embodiments, the FEM circuitry 1108 may include a TX/RX switch to switch between transmit mode and receive mode operation. The FEM circuitry 1108 may include a receive signal path and a transmit signal path. The receive signal path of the FEM circuitry 1108 may include an LNA to amplify received RF signals and provide the amplified received RF signals as an output (e.g., to the RF circuitry 1106). The transmit signal path of the FEM circuitry 1108 may include a power amplifier (PA) to amplify input RF signals (e.g., provided by RF circuitry 1106), and one or more filters to generate RF signals for subsequent transmission by one or more antenna elements of the antenna array 1111.

The antenna array 1111 comprises one or more antenna elements, each of which is configured convert electrical signals into radio waves to travel through the air and to convert received radio waves into electrical signals. For example, digital baseband signals provided by the baseband circuitry 1110 is converted into analog RF signals (e.g., modulated waveform) that will be amplified and transmitted via the antenna elements of the antenna array 1111 including one or more antenna elements (not shown). The antenna elements may be omnidirectional, direction, or a combination thereof. The antenna elements may be formed in a multitude of arranges as are known and/or discussed herein. For example, the antenna array 1111 may include one or more of the antenna assemblies described herein. In some embodiments, the antenna array 1111 may comprise metal strip (e.g., slot) antennas that are at least partially formed by a housing of the computing platform (e.g., platform 1000). The antenna array 1111 may comprise microstrip antennas or printed antennas that are fabricated on the surface of one or more printed circuit boards (e.g., rigid and/or flexible printed circuit boards). The antenna array 1111 may be formed in as a patch of metal foil (e.g., a patch antenna) in a variety of shapes, and may be coupled with the RF circuitry 1106 and/or FEM circuitry 1108 using metal transmission lines or the like.

Processors of the application circuitry 1005 and processors of the baseband circuitry 1110 may be used to execute elements of one or more instances of a protocol stack. For example, processors of the baseband circuitry 1110, alone or in combination, may be used execute Layer 3, Layer 2, or Layer 1 functionality, while processors of the application circuitry 1005 may utilize data (e.g., packet data) received from these layers and further execute Layer 4 functionality (e.g., TCP and UDP layers). As referred to herein, Layer 3 may comprise a RRC layer, described in further detail below. As referred to herein, Layer 2 may comprise a MAC layer, an RLC layer, and a PDCP layer, described in further detail below. As referred to herein, Layer 1 may comprise a PHY layer of a UE/RAN node, described in further detail below.

EXAMPLES

Some non-limiting Examples of various embodiments are provided below.

Example 1 includes an antenna assembly comprising: a first antenna coupled to a ground plane; a second antenna coupled to the ground plane; and an isolation network coupled to the ground plane between the first and second antennas. The isolation network includes: a conductive structure; and an isolation circuit coupled between the conductive structure and the ground plane, wherein the isolation circuit includes a resistor and a capacitor.

Example 2 is the antenna assembly of Example 1, wherein the isolation circuit further includes an inductor, and wherein the resistor, the capacitor, and the inductor are coupled in parallel with one another and coupled between the conductive structure and the ground plane.

Example 3 is the antenna assembly of Example 1, wherein the conductive structure includes: a first portion that is between the first antenna and the second antenna; and a second portion to conductively couple the first portion to the isolation circuit, wherein a width of the first portion is greater than a width of the second portion.

Example 4 is the antenna assembly of Example 3, wherein the second portion and the isolation circuit are included on a flexible printed circuit board.

Example 5 is the antenna assembly of Example 1, wherein at least a part of each of the respective first antenna, the second antenna, and the conductive structure is implemented by a chassis of an electronic device.

Example 6 is the antenna assembly of Example 1, wherein the inductor is a first inductor, wherein the capacitor is a first capacitor, and wherein the first antenna includes a feed network comprising: a feed element to pass a radio frequency (RF) signal to or from a conductive antenna portion of the first antenna; a second inductor coupled between the feed element and an internal node of the feed network; and a second capacitor coupled between the internal node and the ground plane.

Example 7 is the antenna assembly of Example 6, wherein the first antenna further includes a third capacitor coupled between the internal node and the conductive antenna portion.

Example 8 is the antenna assembly of Example 1, wherein the inductor is a first inductor, wherein the capacitor is a first capacitor, and wherein the first antenna includes a feed network comprising: a feed element to pass a radio frequency (RF) signal to or from a conductive antenna portion of the first antenna; a second capacitor coupled between the feed element and an internal node of the feed network; and a second inductor coupled between the internal node and the ground plane.

Example 9 is the antenna assembly of Example 8, further comprising a tuner circuit to control an inductance of the second inductor.

Example 10 is the antenna assembly of Example 9, wherein the tuner circuit is a first tuner circuit, and wherein the antenna assembly further includes: an impedance matching circuit coupled to the conductive antenna portion of the first antenna; and a second tuner circuit to control an impedance characteristic of the impedance matching circuit.

Example 11 is the antenna assembly of Example 1, wherein the first antenna and the second antenna have respective conductive antenna portions with different configurations.

Example 12 is the antenna assembly of Example 1, wherein the first antenna includes a parting line adjacent to a conductive antenna portion of the first antenna, wherein the parting line is a non-conductive material and at least partially defines a shape of the conductive antenna portion.

Example 13 is an antenna assembly comprising: a conductive antenna portion to transmit or receive a radio frequency (RF) signal; and a feed network coupled between the conductive antenna portion and a ground plane. The feed network includes: a feed element to pass the RF signal to or from the conductive antenna portion; a first selected one of a capacitor or an inductor coupled between the feed element and an internal node of the feed network; and a second selected one of the capacitor or the inductor coupled between the internal node and the ground plane.

Example 14 is the antenna assembly of Example 13, wherein the capacitor is a first capacitor, and wherein the feed network further includes a second capacitor coupled between the internal node and the conductive antenna portion.

Example 15 is the antenna assembly of Example 13, further comprising a tuner circuit to control an inductance of the inductor.

Example 16 is the antenna assembly of Example 13, wherein the first selected one is the capacitor and the second selected one is the inductor.

Example 17 is the antenna assembly of Example 13, wherein the first selected one is the inductor and the second selected one is the capacitor.

Example 18 is the antenna assembly of Example 13, wherein the conductive antenna portion and the feed network are included in a first antenna, and wherein the antenna assembly further includes: a second antenna coupled to the ground plane; and an isolation network coupled to the ground plane between the first and second antennas. The isolation network includes: a conductive stub between the conductive antenna portion of the first antenna and a conductive antenna portion of the second antenna; and an isolation circuit coupled between the conductive stub and the ground plane, wherein the isolation circuit includes a resistor and a capacitor coupled in parallel with one another.

Example 19 is a computer system comprising: an antenna assembly and one or more processors coupled to the antenna assembly to communicate over one or more wireless networks via the antenna assembly. The antenna assembly includes: a first antenna coupled to a ground plane and including a first conductive antenna portion to transmit or receive a first radio frequency (RF) signal; a second antenna coupled to the ground plane and including a second conductive antenna portion to transmit or receive the second RF signal; and an isolation network coupled to the ground plane between the first and second antennas. The isolation circuit includes: a conductive structure coupled between the first and second conductive antenna portions; and an isolation circuit with a resistor and a capacitor coupled in parallel with one another and coupled between the conductive structure and the ground plane Example 20 is the computer system of Example 19, wherein the conductive structure includes: a first portion that is between the first and second conductive antenna portions; and a second portion to conductively couple the first portion to the isolation circuit, wherein a width of the first portion is greater than a width of the second portion.

Example 21 is the computer system of Example 20, wherein the second portion and the isolation circuit are included on a flexible printed circuit board.

Example 22 is the computer system of Example 19, wherein at least a part of each of the respective first conductive antenna portion, the second conductive antenna portion, and the conductive structure is implemented by a chassis of the computer system.

Example 23 is the computer system of Example 19, wherein the first antenna further includes a feed network coupled between the first conductive antenna portion and a ground plane, wherein the feed network includes: a feed element to pass the first RF signal to or from the first conductive antenna portion; a first selected one of a second capacitor or an second inductor coupled between the feed element and an internal node of the feed network; and a second selected one of the second capacitor or the second inductor coupled between the internal node and the ground plane.

Example 24 is the computer system of Example 23, wherein the feed network further includes a third capacitor coupled between the internal node and the conductive antenna portion.

Example 25 is the computer system of Example 19, wherein the isolation circuit further includes an inductor coupled in parallel with the resistor and the capacitor.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. An antenna assembly comprising:

a first antenna coupled to a ground plane;

a second antenna coupled to the ground plane, wherein the first and second antennas antenna comprise respective L-shaped conductive portions which extend away from the ground plane and toward one another; and an isolation network coupled to the ground plane between the first and second antennas, wherein the isolation network includes:

a T-shaped conductive structure; and an isolation circuit coupled between the T-shaped conductive structure and the ground plane, wherein:

the isolation circuit includes a resistor and a capacitor;

the T-shaped conductive structure comprises a first portion which extends laterally in a direction between the respective L-shaped conductive portions of the first and second antennas, wherein an edge of the first portion is aligned with an edge of the L-shaped conductive portion of the first antenna and with an edge of the L-shaped conductive portion of the second antenna, and a second portion to conductively couple the first portion to the isolation circuit;

a width of the first portion is greater than a width of the second portion;

in the L-shaped conductive portion of the first antenna, one arm is coupled to and extends away from the ground plane and another arm is coupled to the one arm and extends parallel to the ground plane, toward the first portion of the T-shaped conductive structure;

in the L-shaped conductive portion of the second antenna, one arm is coupled to and extends away from the ground plane and another arm is coupled to the one arm and extends parallel to the ground plane, toward the first portion of the T-shaped conductive structure; and the first antenna comprises a T-shaped conductive portion having a first portion which extends parallel to and is spaced apart from the another arm of the L-shaped conductive portion of the first antenna and a second portion which is coupled to a respective feed network of the first antenna.

2. The antenna assembly of claim 1, wherein the isolation circuit further includes an inductor, and wherein the resistor, the capacitor, and the inductor are coupled in parallel with one another and coupled between the T-shaped conductive structure and the ground plane.

3. The antenna assembly of claim 1, wherein the second portion and the isolation circuit are included on a flexible printed circuit board.

4. The antenna assembly of claim 1, wherein the antenna assembly is in an electronic device having a metal chassis, and the respective L-shaped conductive portions of the first and second antennas and the T-shaped conductive structure are implemented by the metal chassis.

5. The antenna assembly of claim 1, wherein the first antenna includes a parting line adjacent to the respective L-shaped conductive portion of the first antenna, wherein the parting line is a non-conductive material and at least partially defines a shape of the conductive antenna portion.

6. The antenna assembly of claim 1, wherein the antenna assembly is in an electronic device having a base, the edge is an edge of the base, and the respective L-shaped conductive portions of the first and second antennas and the first portion of the T-shaped conductive structure extend along the edge of the base.

7. The antenna assembly of claim 1, wherein the antenna assembly is in an electronic device having a base, and the respective L-shaped conductive portions of the first and second antennas and the first portion of the T-shaped conductive structure extend along a back cover of the base.

8. A computer system, comprising:
a metal chassis;
a ground plane;
an antenna assembly comprising:
a first antenna coupled to the ground plane and including a first L-shaped conductive antenna portion to transmit or receive a first radio frequency (RF) signal;
a second antenna coupled to the ground plane and including a second L-shaped conductive antenna portion to transmit or receive a second RF signal, wherein the respective L-shaped conductive antenna portions extend away from the ground plane and toward one another; and
an isolation network coupled to the ground plane between the first and second antennas, wherein the isolation network includes:
a T-shaped conductive structure coupled between the first and second L-shaped conductive antenna portions; and
an isolation circuit with a resistor and a capacitor coupled in parallel with one another and coupled between the T-shaped conductive structure and the ground plane; wherein:
the T-shaped conductive structure comprises a first portion which extends laterally in a direction between the respective L-shaped conductive antenna portions, wherein an edge of the first portion is aligned with an edge of the L-shaped conductive antenna portion of the first antenna and with an edge of the L-shaped conductive antenna portion of the second antenna, and a second portion to conductively couple the first portion to the isolation circuit, and the first antenna, the second antenna and the T-shaped conductive structure are implemented by the metal chassis;
in the first L-shaped conductive antenna portion, one arm is coupled to and extends away from the ground plane and another arm is coupled to the one arm and extends parallel to the ground plane, toward the first portion of the T-shaped conductive structure;
in the second L-shaped conductive antenna portion, one arm is coupled to and extends away from the ground plane and another arm is coupled to the one arm and extends parallel to the ground plane, toward the first portion of the T-shaped conductive structure; and
the first antenna comprises a T-shaped conductive portion having a first portion which extends parallel to and is spaced apart from the another arm of the first L-shaped conductive antenna portion and a second portion which is coupled to a respective feed network of the first antenna; and
one or more processors coupled to the antenna assembly to communicate over one or more wireless networks via the antenna assembly.

9. The computer system of claim 8, wherein in the T-shaped conductive structure, a width of the first portion is greater than a width of the second portion.

10. The computer system of claim 8, wherein edges of the first and second L-shaped conductive antenna portions and the first portion of the T-shaped conductive structure are aligned.

11. The computer system of claim 8, wherein the first antenna further includes a feed network coupled between the first conductive antenna portion and a ground plane, wherein the feed network includes:
a feed element to pass the first RF signal to or from the first conductive antenna portion;
a first selected one of a second capacitor or an second inductor coupled between the feed element and an internal node of the feed network;
a second selected one of the second capacitor or the second inductor coupled between the internal node and the ground plane; and
a third capacitor coupled between the internal node and the conductive antenna portion.

12. The computer system of claim 8, wherein the isolation circuit further includes an inductor coupled in parallel with the resistor and the capacitor.

13. The computer system of claim 8, wherein edges of the first and second L-shaped conductive antenna portions and the first portion of the T-shaped conductive structure are aligned at a back cover of the computer system.

* * * * *